United States Patent
Drepper

(10) Patent No.: US 10,768,916 B2
(45) Date of Patent: Sep. 8, 2020

(54) DYNAMIC GENERATION OF CPU INSTRUCTIONS AND USE OF THE CPU INSTRUCTIONS IN GENERATED CODE FOR A SOFTCORE PROCESSOR

(71) Applicant: Red Hat, Inc., Raleigh, NC (US)

(72) Inventor: Ulrich Drepper, Grasbrunn (DE)

(73) Assignee: Red Hat, Inc., Raleigh, NC (US)

( * ) Notice: Subject to any disclaimer, the term of this patent is extended or adjusted under 35 U.S.C. 154(b) by 0 days.

(21) Appl. No.: 16/203,097

(22) Filed: Nov. 28, 2018

(65) Prior Publication Data

US 2020/0167139 A1    May 28, 2020

(51) Int. Cl.
*G06F 8/41* (2018.01)
*G06F 30/34* (2020.01)
*G06F 8/30* (2018.01)

(52) U.S. Cl.
CPC ............ *G06F 8/447* (2013.01); *G06F 8/30* (2013.01); *G06F 8/436* (2013.01); *G06F 8/4432* (2013.01); *G06F 8/45* (2013.01); *G06F 30/34* (2020.01)

(58) Field of Classification Search
None
See application file for complete search history.

(56) References Cited

U.S. PATENT DOCUMENTS

| | | | |
|---|---|---|---|
| 9,218,443 B1 | 12/2015 | Styles et al. | |
| 2006/0117274 A1* | 6/2006 | Tseng | G06F 17/5022 716/106 |
| 2007/0277161 A1* | 11/2007 | Herbordt | G06F 8/447 717/140 |
| 2011/0307233 A1* | 12/2011 | Tseng | G06F 17/5022 703/14 |
| 2014/0026111 A1* | 1/2014 | Stitt | G06F 9/4484 717/101 |
| 2017/0323045 A1* | 11/2017 | Huang | G06F 17/5054 |
| 2019/0095229 A1* | 3/2019 | Guo | G06F 8/44 |
| 2019/0187979 A1* | 6/2019 | Carey | G06F 8/71 |
| 2020/0050490 A1* | 2/2020 | Schardt | G06F 9/5077 |
| 2020/0057681 A1* | 2/2020 | Mamaghani | G06F 11/3628 |
| 2020/0057685 A1* | 2/2020 | Schardt | G06F 9/543 |

OTHER PUBLICATIONS

Moritz Gabriel Schmid, Rapid Prototyping for Hardware Accelerators in the Medical Imaging Domain, Thesis, Jul. 24, 2015, 246 pages, Friedrich-Alexander University Erlangen-Nürnberg, Nuremberg, Germany.

* cited by examiner

*Primary Examiner* — Daxin Wu
(74) *Attorney, Agent, or Firm* — Lowenstein Sandler LLP

(57) ABSTRACT

In one embodiment, a method may receive, by a compiler of a host computing system, source code for a computer application. The method may also include separating a first portion of the source code and a second portion of the source code that are to be compiled for execution by an accelerator operatively coupled to the host computing system. The method may also include compiling the first portion of the source code to generate hardware description language code. A logic block is to be generated on the accelerator in view of the hardware description language code. The method also includes compiling the second portion of the source code to generate softcore processor code, and adding instructions to the softcore processor code to cause the softcore processor code to interact with the logic block during execution of the softcore processor code and the logic block.

20 Claims, 9 Drawing Sheets

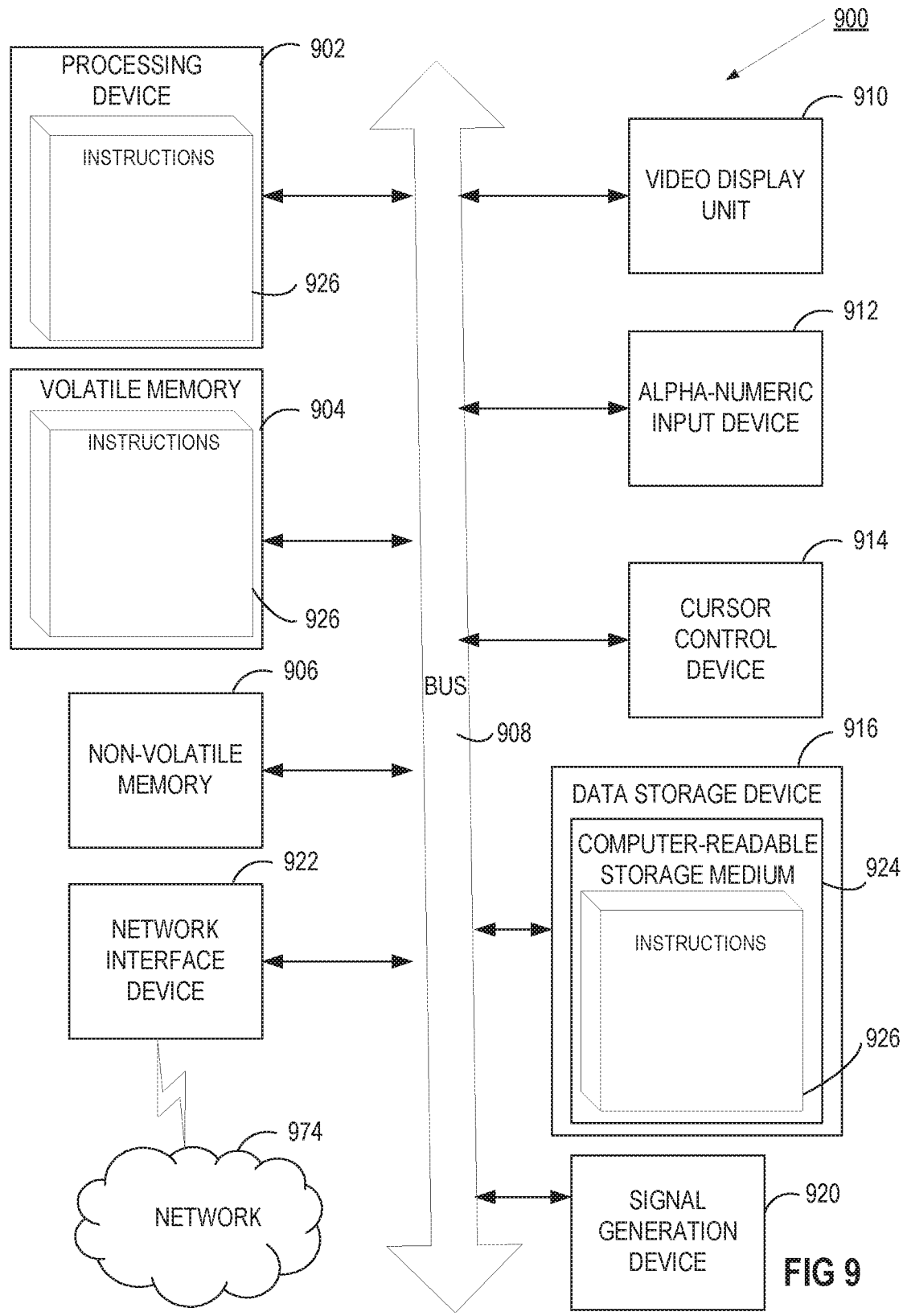

US 10,768,916 B2

DYNAMIC GENERATION OF CPU INSTRUCTIONS AND USE OF THE CPU INSTRUCTIONS IN GENERATED CODE FOR A SOFTCORE PROCESSOR

TECHNICAL FIELD

The present disclosure is generally related to a computing environment, and more particularly, to dynamic generation of central processing unit (CPU) instructions and use of the CPU instructions in generated code for a softcore processor.

BACKGROUND

Source code that implements a computer application may be translated by a compiler into code that can be generated (e.g., assembler code, hardware description language code, etc.). Assembler code that is generated by compilers is limited to the instruction set of the CPU on which the code is targeted to be executed. In high performance computing, the source code may include operations that are computationally intensive and that, when executed by the CPU, are limited in speed by the design of the CPU. In some instances, accelerators may be better options to execute the code because they can handle computationally intensive operations better through more parallelism. Accelerators may refer to a hardware device that functions to enhance the performance of a computer application and/or computer system. Some accelerators include Field Programmable Gate Arrays (FPGAs), Application-Specific Integrated Circuits (ASICs), and/or General Purpose Graphic Processing Units (GPGPUs). Certain accelerators may be programmed to implement the code of a computer application and the results may be faster than what could be implemented by the CPU.

BRIEF DESCRIPTION OF THE DRAWINGS

The present disclosure is illustrated by way of examples, and not by way of limitation, and may be more fully understood with references to the following detailed description when considered in connection with the figures, in which:

FIG. 9 depicts a block diagram of an illustrative computing device operating in accordance with the examples of the present disclosure.

DETAILED DESCRIPTION

Figure 1:
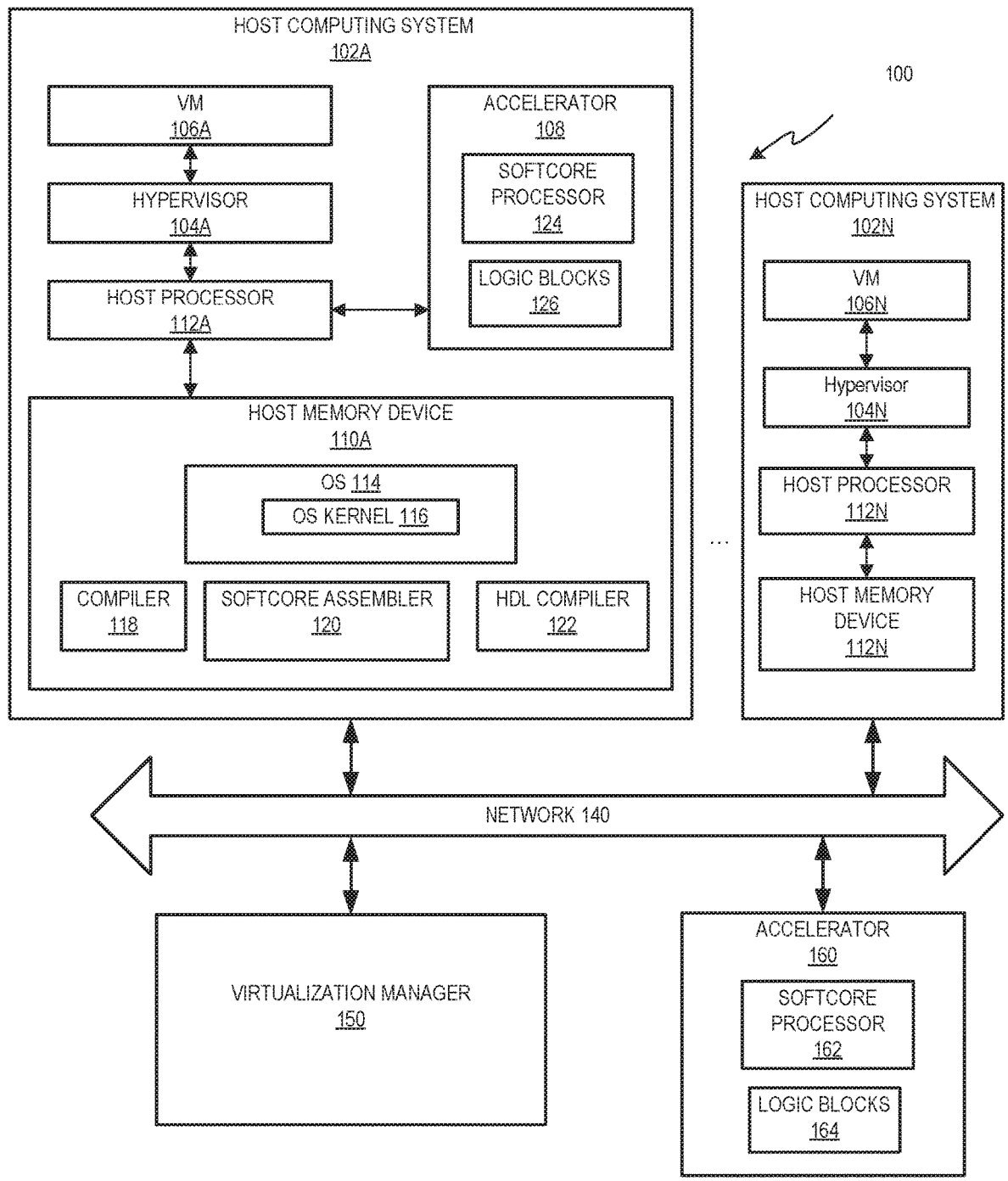
FIG. 1 depicts a high-level block diagram of an example computing environment that enables dynamic generation of CPU instructions and use of the CPU instructions in generated code, in accordance with one or more aspects of the present disclosure.

In some instances, software developers may write source code for a computer application. The source code may include portions that do not involve computationally intensive operations and portions that do involve computationally intensive operations. The computationally intensive operations may include specialized operations that are critical to the performance of the processor executing the computer application. Specialized operations are oftentimes included in computer applications for high performance computing related to scientific, analytics, engineering, consumer, enterprise, etc. applications. Example specialized operations may include training and using a machine learning model (e.g., deep learning using neural networks in areas such as video analytics, speech recognition, natural language processing, automated vehicle control, etc.), performing complex mathematical operations (e.g., dense linear algebra), big data analysis, rendering complex graphics (e.g., three-dimensional visualization), routing data in a network, and the like.

The software developer may determine that an accelerator is a better option to use than just a CPU because of the accelerator's superior processing power, memory bandwidth, and/or efficiency as compared to the CPU. Accelerators may refer to a hardware device that functions to enhance the performance of a computer application and/or computer system. Accelerators may provide enhanced processing capabilities in part due to parallelization that enables performing multiple operations at the same time.

Some accelerators include Field Programmable Gate Arrays (FPGAs), Application-Specific Integrated Circuits (ASICs), and/or General Purpose Graphic Processing Units (GPGPUs). ASICs are hardware devices that have a fixed functionality determined when the hardware device is created and cannot be reprogrammed during use. FPGAs are hardware devices that include fixed function blocks in a similar way as ASICs, but also freely programmable logic elements and the connections between the blocks in the FPGAs can be controlled and reprogrammed when the FPGA is used. Accelerators may be programmed using a hardware description language (HDL) code, which is different than normal programming languages (e.g., C, C++, etc.) in that extensive knowledge of how the hardware works is needed to create a circuit.

Conventionally, entire large portions of the source code associated with the specialized operations that are computationally intensive and the general, all-purpose operations (e.g., administrative operations and input/output (I/O) operations) associated with the specialized operations are translated into HDL code that can be executed on the accelerator. The remaining portions of the source code may be compiled to run on a host processor of a host computing system that is operatively coupled to the accelerator. The HDL code may be compiled into a representation of hardware logic (e.g., a bitstream of binary code) for execution on the accelerator.

An HDL compiler may synthesize the HDL code into a low-level format, which allows the result to be mapped to the individual hardware components provided by the accelerator. Further, a place and route stage performed by the HDL compiler may map the intermediate low-level format to the actual hardware available on the accelerator (e.g., FPGA) by generating the configuration for each of the different components, such as lookup tables and the routing tables. The result is the representation of hardware logic (e.g., the bitstream), which may be transmitted (e.g., downloaded, uploaded, etc.) to the accelerator (e.g., FPGA) for execution. Transmitting the representation of hardware logic translated from the HDL code may cause a logic block to be instantiated on the accelerator. A logic block may represent a circuit by implementing hardware logic using the lookup tables, routing tables, etc. to perform the specialized operations. During the place and route stage, the HDL compiler may perform optimizations, which arranges the available logic for the highest performance and lowest resource utilization. These optimizations can consume undesirable processing resources by taking a long time to complete, especially for large portions of code including specialized operations and administrative operations, as the process may take upwards of hours or days to complete using the HDL compiler. Further, most software developers lack the extensive knowledge of how to write the HDL code to create a circuit, much less a circuit for a specialized operation that reliably works at high frequencies. Further, conventional tools do not fit into the software development environment for programming the accelerators due to the high compile times of large pieces of HDL code.

Another problem is that the CPU running on a host system operatively coupled to the accelerator is limited to the instruction set provided by the manufacturer of the CPU. The instruction set provided by CPU manufacturers may include widely applicable instructions that are not tailored for specific computer applications. For HDL code that is tailored to perform identified operations in an optimal way, it is unlikely that an instruction with exactly the right semantic is already defined. This may be particularly true when the HDL code implements specialized operations that are computationally intensive (e.g., performing multiple complex mathematical operations in parallel) and specific to a computer application.

Further compounding the issue, even if a logic block generated in view of HDL code implements an operation (e.g., a simple addition mathematical operation) that can be called by an available instruction in an instruction set provided by a CPU manufacturer, a compiler may not attempt to insert the instruction into compiled code to enable interaction with the logic block running on the accelerator. Instead, the software developer may be forced to identify the instruction and use intrinsics to explicitly direct the compiler to emit the particular instruction from the instruction set. An intrinsic may refer to an operation that is directly implemented by the compiler instead of linking to a library-provided implementation of the operation. Like writing HDL code, software developers may lack the knowledge of how to implement an instruction using intrinsics.

Aspects of the present disclosure address the above and other deficiencies by providing technology that dynamically generates central processing unit (CPU) instructions and uses the CPU instructions in generated code for the application softcore processor. Source code for a computer application may be received by a compiler. The computer application may include portions (e.g., certain specialized operations and related administrative operations and/or I/O operations) that can benefit from acceleration by being executed faster on an accelerator (e.g., FPGA, GPGPU, etc.). In some embodiments, the compiler may identify these portions of the source code that can benefit from acceleration. For example, the source code may include information that indicates that the portions are to be compiled for transmission to the accelerator. The information may be specified in the source code with programming extensions like Open Multi-Processing (OpenMP), OpenACC, etc., which allow expressing different forms of parallelism that can be used in the generated code but also allows to express the possibility to execute the code in a different address space (e.g., on a separate accelerator). The information may be referred to as annotations that mark the portions of the source code to be compiled for transmission to the accelerator.

In some embodiments, the compiler may automatically determine that the portions are to be compiled for transmission to the accelerator. For example, the compiler may determine that the portions of the source code satisfy criteria for acceleration by being compiled for transmission to the accelerator. The criteria may be satisfied based on results of performing optimizations and/or simulations on operations in the portions of the source code during compilation, identifying certain types (e.g., complex iterative loops) of operations in the source code during compilation, or the like. For example, the compiler may perform an optimization and/or simulation on operations in the portions during compilation and determine that the operations are to be compiled for transmission to the accelerator if performance of the operations can be enhanced by a threshold amount (e.g., satisfying a criterion) by being executed on the accelerator as opposed to the host processor of the host computing system. Additionally, the compiler may determine how long each portion of the source code will take to execute and if the simulated execution time for any portion is above a threshold amount (e.g., satisfying a criterion), then the compiler may determine that those portions are to be compiled for transmission to the accelerator. The portions of the source code to be compiled for transmission to the accelerator may be referred to as kernels herein.

The source code may be separated into portions to be executed by the host processor and portions to be transmitted to the accelerator. The portions to be executed by the host processor may not have been identified for acceleration and may be compiled into host object code. The portions to be transmitted to the accelerator may have been identified for acceleration and may be compiled into HDL code for operations that are computationally intensive and softcore processor code for the remainder of the portions (e.g., administrative operations and/or I/O operations) identified for acceleration. In this manner, the compiler may minimize the code that is formulated in the HDL code, thereby minimizing the HDL compilation process and reducing the amount of compute resources used to compile the code into the HDL code.

A softcore processor may refer to an implementation of a processor that runs on the accelerator and that is specific for the computer application. The compiler may use a suitable architecture (e.g., RISC-V) for the softcore processor implemented by the softcore processor code that enables extending the instruction set of the softcore processor. In some embodiments, the compiler may generate one or more instructions (application-specific instructions) and add the instructions to the softcore processor code. The instructions may allow the softcore processor code to interact with a logic block generated in view of the HDL code on the accelerator. The instructions may define one or more semantics for calling the specialized operations implemented by the logic block that is defined by the HDL code associated with the computer application. In some embodiments, the instruction may not be persisted and recompilation of the source code may cause another instruction to be defined based on the HDL code that is generated. Further, the HDL code may change between compilations, for example, by including operations that cause instructions to be defined with completely different semantics than prior compilations and/or subsequent compilations.

Further, source code for a second identified kernel of a second computer application may be compiled and a second instruction, different from the instruction generated for the softcore processor code described above, may be generated and added to the same and/or different softcore processor code to enable interaction with second logic blocks generated in view of second HDL code. In this way, the generated instructions that extend instructions of the instruction set architecture implemented by the softcore processor may be configurable. The instructions may be dynamically generated on the fly during compilation and may be specific for the particular operations that are defined by the HDL code. Further, adding the one or more instructions to the softcore processor code may tailor the softcore processor to be specific for the computer application.

In some embodiments, multiple HDL code may be generated for different specialized operations and the multiple HDL code may be translated into one or more bitstreams that are transmitted (e.g., uploaded, downloaded, etc.) to the accelerator. The one or more bitstreams (representations of hardware logic) may implement one or more logic blocks on the accelerator. Further, multiple softcore processor code may be generated to enable instantiation of multiple softcore processors on the accelerator. Each softcore processor or set of softcore processors may be configured with one or more instructions to interact with the logic blocks including the specialized operation or operations implemented by the logic blocks on the accelerator. Each of the logic blocks may execute independently and/or in parallel from each other and/or the softcore processor instantiations on the accelerator. Thus, parallelization may be enhanced, thereby improving resource utilization and performance of executing the computer application.

One or more compilers and/or one or more assemblers may be used by the host computing system in the embodiments described herein. For example, a first compiler may generate host object code (e.g., including operations not identified for acceleration), softcore processor code, and the HDL code. The softcore processor code may refer to softcore processor assembler code that is input to a softcore assembler. The softcore assembler may assemble the softcore processor assembler code into softcore processor object code. In some embodiments, the softcore processor code may refer to the softcore processor object code. In some embodiments, the softcore processor code may refer to a portion of a representation of hardware logic generated from a portion of the HDL code that is for a softcore processor. In some embodiments, the softcore assembler may generate the HDL code instead of the first compiler. In some embodiments, the HDL code may be generated from the first compiler directly. The HDL code may be input to a HDL compiler that compiles the HDL code into a representation of hardware logic (e.g., a bitstream).

The host object code, the softcore processor object code, and the representation of hardware logic (bitstream) may be packaged into a binary for the computer application. The OS kernel of the host computing system may receive the binary for the computer application and extract the host object code, softcore processor object code, and the representation of hardware logic. The OS kernel (e.g., an OS kernel driver) may transmit the softcore processor object code and the representation of the hardware logic to the accelerator. Transmitting the representation of the hardware logic to the accelerator may cause a softcore processor to be instantiated because the representation of the hardware logic may include translated HDL code related to the softcore processor. Additionally, transmitting the representation of the hardware logic to the accelerator may cause a logic block to be instantiated on the accelerator in view of the representation of the hardware logic. The OS kernel may instruct the accelerator to execute the softcore processor object code, using the logic block when the generated instruction is encountered. The OS kernel may also instruct the host processor to begin execution of the computer application by executing the host object code.

When the host processor encounters the portions of the host object code that are accelerated in the computer application, the host processor executes one or more operation calls included in the host object code that cause the OS kernel driver to communicate with the accelerator. The communication may request the accelerator to execute the softcore processor object code. The softcore processor object code may include the one or more instructions that enable interacting with the logic block instantiated by transmitting the representation of hardware logic (e.g., a bitstream that was generated using the HDL code) to the accelerator.

The accelerator may execute the softcore processor object code. When the accelerator encounters, in the softcore processor object code, the instruction to interact with the logic block, the accelerator may execute the instruction which leads to the performance of the computationally intensive operation that is implemented by the logic block. The logic block may return a result to the instantiation of the softcore processor executing the softcore processor object code that can use the result in further execution and/or transmit the result to the host processor executing the host object code.

The systems and methods described herein include technical improvements to a computing environment. In particular, aspects of the present disclosure may enhance the performance of a computing system by identifying and generating HDL code for just specialized computationally intensive operations (e.g., core operations) of portions of source code identified for acceleration. Minimizing the amount of the source code that is compiled into HDL code may reduce the compile time, thereby saving compute resources and improving efficiency. Further, aspects of the present disclosure may improve the performance of computer applications by generating application-specific instructions on the fly to allow softcore processor code to interact with logic blocks generated from HDL code implementing the specialized operations of the computer application. Extending the instruction set of the softcore processor on the accelerator may enable any computer application to be implemented on an accelerator, thereby improving the performance of the computer application. Various aspects of the above referenced methods and systems are described in details herein below by way of examples, rather than by way of limitation.

FIG. 1 depicts an illustrative architecture of elements of a computing environment 100, in accordance with an embodiment of the present disclosure. Computing environment 100 may include host computing systems 102A-102N, a virtualization manager 150, and/or an accelerator 160 that are operatively coupled via a network 140. It should be noted that other computing environments 100 are possible, and that the implementations of the computing environment 100 utilizing embodiments of the disclosure are not necessarily limited to the specific computing environment 100 depicted.

Host computing system 102A-102N may each be a single computing machine or may be multiple computing machines arranged in a homogeneous or heterogeneous group (e.g., cluster, grid, server farm). Host computing system 102A-102N may include one or more rack mounted servers, workstations, desktop computers, notebook computers, tablet computers, mobile phones, palm-sized computing devices, personal digital assistants (PDAs), etc. In one example, host computing system 102A-102N may be a computing device implemented with x86 hardware. In another example, host computing system 102A-102N may be a computing device implemented with PowerPC®, SPARC®, other hardware, or a combination thereof. In either example, host computing system 102A-102N may include one or more hardware resources.

Hardware resources may provide hardware features for performing computing tasks. In one example, one or more of the hardware resources may correspond to a physical device of host computing system 102A-102N. In another example, one or more of the hardware resources may be provided by hardware emulation and the corresponding physical device may be absent from computer system. For example, host computing system 102N may be a server machine that does not include an accelerator (e.g., General Purpose Graphic Processing Unit (GPGPU)) or includes a graphics device that does not support a particular hardware feature. Hypervisor 104N may provide the hardware feature of the hardware resource by emulating a portion of the hardware resource (e.g., provide a virtualized GPGPU). The emulation of a portion of a hardware resource may be provided by hypervisor 104N, virtual machine 106N, host operating system (not shown), another hardware resource, or a combination thereof.

Hardware resources may include a network interface device, an accelerator 108, a host memory device 110A-110N, host processor 112A-112N, other physical or emulated devices, or combination thereof. Network interface device may provide access to a network internal to the host computing system 102A-102N or external to the host computing system 102A-102N (e.g., network 140) and in one example may be a network interface controller (NIC).

Host processor 112A-112N may refer to devices capable of executing instructions encoding arithmetic, logical, or I/O operations. Host processor 112A-112N may be a single core processor, which may be capable of executing one instruction at a time (e.g., single pipeline of instructions) or a multi-core processor, which may simultaneously execute multiple instructions. One or more of the hardware resources may be combined or consolidated into one or more physical devices or may partially or completely emulated by hypervisor 120 as a virtual device.

Host memory device 110A-110N may include any data storage that is capable of storing digital data, such as physical memory devices including volatile memory devices (e.g., RAM), non-volatile memory devices (e.g., NVRAM), other types of memory devices, or a combination thereof. Host memory device 110A-110N may include mass storage devices, such as solid-state storage (e.g., Solid State Drives (SSD)), hard drives, other persistent data storage, or a combination thereof.

In some embodiments, host memory device 110A-110N may store a host operating system (OS) 114 including an OS kernel 116, a compiler 116, a softcore assembler 120, and an HDL compiler 122. The OS 114 may include any suitable type of operating system (e.g., Linux®, Windows®, MacOS®, etc.) that is capable of managing the memory and processes, and software and hardware of the host computing system 102A-102N. The OS 114 may control the tasks performed by the host processor 112A-112N and manage system resources. For example, the OS kernel 116 may enable access to an accelerator 108 and/or 160 to send and receive data, perform operations, execute instructions, and so forth.

The compiler 118 may be implemented in computer instructions stored on the host memory device 110A-110N and executed by the host processor 112A-112N. The compiler 118 may receive source code written in a first form (e.g., C, C++, Fortran) for a computer application and compile it into code in a second form (e.g., binary code, assembly language code, HDL code, etc.) that is different than the first form. In some embodiments, the compiler 118 may identify portions of the source code that are to be compiled for transmission to the accelerator 108 and/or 160 and portions of the source that are to be compiled for execution by the host processor 112A-112N. The compiler 118 may identify the different portions using annotations provided in the source code by programming language extensions, such as OpenMP or OpenACC, and/or the compiler 118 may identify the different portions by automatically determining which portions are to be compiled by for transmission to the accelerator 108 and/or 160 for the host processor 112A-112N.

For the portions of the source code to be compiled for transmission to the accelerator 108 or 160, the compiler 118 may generate softcore processor code for non-computationally intensive operations (e.g., administrative operations, I/O operations, etc.) and generate HDL code for computationally intensive operations. A logic block may be instantiated on the accelerator in view of the HDL code for the computationally intensive operations. HDL code for the softcore processor implementation may be generated and a new instruction associated with the logic block that performs the computationally intensive operations may be added to the HDL code for the softcore processor implementation to enable the softcore processor code running on the softcore processor implementation to connect to the logic block to use the new instruction. Further, the compiler 118 may dynamically (on the fly) generate and add one or more instructions to the softcore processor code (e.g., softcore processor assembler code and/or softcore processor object code) to enable interacting with the logic block generated in view of the generated HDL code. The instructions may be application-specific instructions that define one or more semantics for calling the computationally intensive operations implemented by the logic block. In some embodiments, the compiler 118 may add an operation, information, metadata, and/or reference in the HDL code for the softcore processor, which may allow the instructions to be used in the softcore processor code.

The softcore assembler 120 may be implemented in computer instructions stored on the host memory device 110A-110N and executed by the host processor 112A-112N. The assembler 120 may receive assembly language code (e.g., softcore processor code or softcore processor assembler code) included in a portion of source code of a computer application that is identified for acceleration from the compiler 118. The assembly language code may include one or more non-computationally intensive operations (e.g., administrative and/or I/O operations) or operations that may not be translated to HDL code for various other reasons. The softcore assembler 120 may compile the assembly language code into binary code (e.g., softcore processor object code) executable by one or more processing devices of the accelerator 108. The softcore processor object code may be stored in a memory (e.g., RAM) of the accelerator 108. In some embodiments, the softcore assembler 120 may compile a portion of the assembly language code into the HDL code 206. In some embodiments, the HDL code 206 is generated by the compiler 118.

The HDL compiler 122 may be implemented in computer instructions stored on the host memory device 110A-110N and executed by the host processor 112A-112N. The HDL compiler 122 may receive the HDL code 206 for one or more computationally intensive operations included in a portion of source code of the computer application that is identified for acceleration from the compiler 118 and/or the softcore assembler 122. The HDL compiler 122 may compile the HDL code 206 into a representation of hardware logic (e.g., bitstream) executable by one or more processing devices of the accelerator 108. The representation of hardware logic may be transmitted to the accelerator 108 and/or 160, which may cause the softcore processor 124 and/or 162 to be instantiated. In some embodiments, the representation of the hardware logic, when transmitted to the accelerator 108, may implement a circuit that instantiates various logic blocks 126 and/or 164 included in the accelerator 108 and/or 160 to perform the specialized computationally intensive operation associated with the computer application. The instantiated softcore processor 124 and/or 162 may execute the softcore processor object code 208 that includes the instructions to interact with the logic blocks 126 and/or 164.

For the portions of the source code to be compiled for execution by the host processor 112A-112N, the compiler 118 may generate host object code. The host object code 202 may include an operation call to an OS kernel driver to enable communication with the program running on the softcore processor 124 or 162 of the accelerator 108 and/or 160.

The host object code, the softcore processor object code, and the representation of the hardware logic (e.g., bitstream) may be packaged into a binary for the computer application and provided to the OS kernel 116. In some embodiments, the host object code, the softcore processor object code, and the representation of the hardware logic may not be packaged together and may be stored separately. The OS kernel 116 may extract the host object code, the softcore processor object code, and the representation of the hardware logic (e.g., bitstream) 212 from the package. The OS kernel 116 may transmit the representation of hardware logic to the accelerator, which may cause the softcore processor 124 and the logic block 126 to be instantiated. The softcore object code 208 may be independently transmitted or transmitted at the same time as the representation of the hardware logic 212 to the accelerator 108 and/or 160. The OS kernel 116 may instruct the softcore processor 124 and/or 162 to execute the softcore processor object code 208 including the instructions to interact with the logic blocks 126 and/or 164 including the specialized operation.

The accelerator 108 and/or 160 may include any suitable hardware device (e.g., GPGPU or a Field Programmable Gate Array (FPGA)) capable of improving the performance of a computer application and/or the host computing system 102A-102N. In some embodiments, as depicted in host computing system 102A, the accelerator 108 may be operatively coupled to the host processor 112A within the host computing system 102A. In some embodiments, as depicted by host computing system 102N, the accelerator 160 or 108 may be external to the host computing system 102N and operatively coupled to the host computing system 102N via the network 140. For example, the accelerator 160 may be a standalone device that is accessed by the host computing system 102N and/or 102A when the host computing system 102N lacks its own accelerator or when the host computing system 102A desires to offload operations to the accelerator external to the host computing system 102A.

When the softcore processor 124 and/or 162 is instantiated and running the softcore processor object code and the logic blocks 126 and/or 164 are programmed with the representation of the hardware logic, the host processor 112A may initiate execution of the computer application by executing the host object code. When the host processor 112A-112N executes the host object code, the portions that were identified for acceleration may be encountered and the host processor may execute the operation call in the host object code to cause the OS kernel 116 to communicate with the accelerator 108 and/or 162 executing the softcore processor object code on the softcore processor 124 and/or 162. Then, when the dynamically generated instruction included in the softcore processor code that enables interaction with the logic blocks 124 and/or 126 is encountered by the softcore processor, the instruction may be executed to cause the operation implemented of the HDL code by the logic block to be executed on the accelerator 108 or 160. The logic block 124 and/or 126 may perform an operation to obtain a result and may return the result to the softcore processor 124 for further operations and/or for transmission of the result to the host processor 112A.

Hypervisor 104A-104N may also be known as a virtual machine monitor (VMM) and may provide virtual machine 106A-106N with access to one or more features of the underlying hardware resources. In the example shown, hypervisor 104A-104N may run directly on the hardware of host computing system 102A-102N (e.g., host machine). In other examples, hypervisor 104A-104N may run on or within a host operating system (not shown). Hypervisor 104A-104N may manage system resources, including access to hardware resources. Hypervisor 104A-104N, though typically implemented as executable code, may emulate and export a bare machine interface to higher-level executable code in the form of virtual processors and guest memory. Higher-level executable code may comprise a standard or real-time operating system (OS), may be a highly stripped down operating environment with limited operating system functionality and may not include traditional OS facilities, etc. Hypervisor 104A-104N may support any number of virtual machines (e.g., a single VM, one hundred VMs, etc.).

Virtual machine 106A-106N may execute guest executable code based on an underlying emulation of the hardware resources. Virtual machine 106A-106N may support, for example, hardware emulation, full virtualization, para-virtualization, operating system-level virtualization, other virtualization technology, or a combination thereof. Virtual machine 106A-106N may include a guest operating system, which may include one or more of Linux®, Microsoft® Windows®, Solaris®, or other operating system.

The virtualization manager 150 may be hosted by a computer system and include one or more computer programs implemented as computer instructions and executed by the computer system for centralized management of the host computing system 102A-102N. In one implementation, the virtualization manager 150 may include various interfaces, including administrative interface, reporting interface, and/or application programming interface (API) to communicate with the host computing system 102A-102N and/or the accelerator 160 computing environment 100, as well as to user portals, directory servers, and various other components, which are omitted from FIG. 1 for clarity.

Network 140 may be a public network (e.g., the internet), a private network (e.g., a local area network (LAN), wide area network (WAN)), or a combination thereof. In one example, network 140 may include a wired or a wireless infrastructure, which may be provided by one or more wireless communications systems, such as a wireless fidelity (WiFi) hotspot connected with the network 140 and/or a wireless carrier system that can be implemented using various data processing equipment, communication towers, etc.

Figure 2:
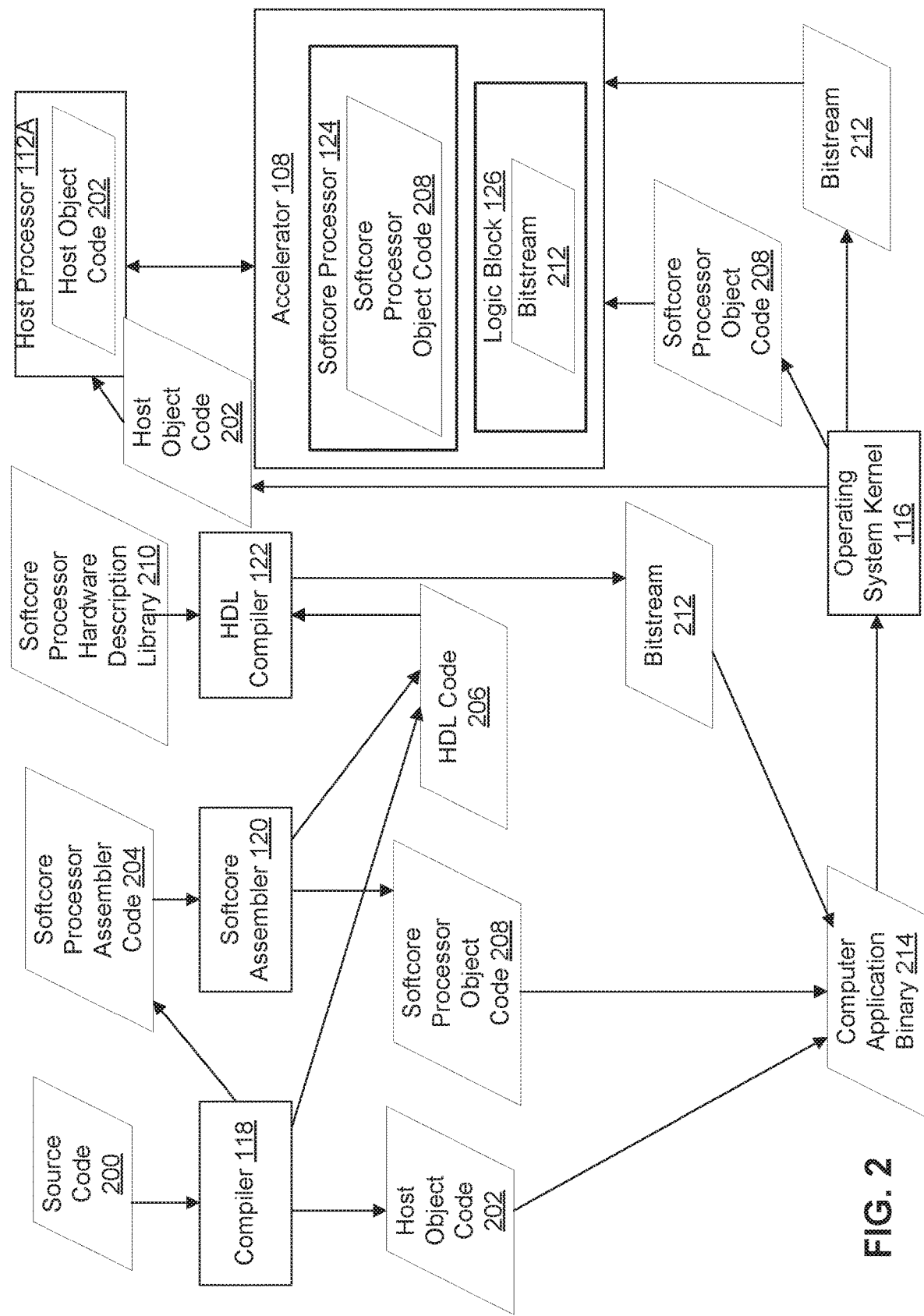
FIG. 2 depicts a block diagram of dynamically generating CPU instructions and use of the CPU instructions in generated code, in accordance with one or more aspects of the present disclosure.

FIG. 2 depicts a block diagram of dynamically generating CPU instructions and use of the CPU instructions in generated code for a softcore processor, in accordance with one or more aspects of the present disclosure. Source code 200 for a computer application may be received by compiler 118. The source code 200 may be written in any suitable programming language (e.g., C, C++, Fortran). The compiler 118 may identify one or more portions of the source code to be compiled for transmission to the accelerator 108, and one or more portions of the source code to be compiled for execution by the host processor 112A.

Although just accelerator 108 is depicted in FIG. 2, it should be understood that any suitable accelerator (e.g., accelerator 160) may be substituted or additionally included if the accelerator can be operatively coupled to the host processor 112A. Further, although just host processor 112A is depicted in FIG. 1, the techniques may be applicable to any suitable processor (e.g., 112N) that is operatively coupled to the accelerator 108.

The compiler 118 may generate host object code 202 for the portion of the source code 200 that is to be executed by the host processor 112A. The host object code 202 may be binary code that is executable by a type (e.g., x86) of the host processor 112A. The host object code 202 may include operations in the one or more portions of the source code 200 that were not identified for acceleration.

The compiler 118 may generate HDL code 206 for core operations (e.g., computationally intensive specialized operations) of the portion of the source code 200 identified to be transmitted to the accelerator 108. The core operations may be critical to the performance of the computer application and/or directly available compute resources (e.g., host processor 112A). The HDL code 206 generated may be minimized to the amount of the source code 200 identified for acceleration, thereby improving performance of the compilation process through the HDL compiler 122 and saving compute resources. In some embodiments, the compiler 118 may match the source code 200 to code sequences for which the compiler 118 can generate HDL code 206 and emit references to these appropriate pre-defined HDL code. For example, a library may be used to add the pre-defined HDL code to the compiler-generated HDL Code. In some embodiments, the compiler 118 may dynamically generate the HDL code 206 for the portion of the source code 200 identified to be executed by the accelerator 108.

Further, the compiler 118 may generate softcore processor code (e.g., softcore processor assembler code 204) for non-computationally intensive operations of the portion of the source code identified to be transmitted to the accelerator to be executed by a softcore processor 124 of the accelerator 108. The compiler 118 may emit configurations in the softcore processor assembler code 204 for the softcore processors to execute on the accelerator 108. In some embodiments, the compiler 118 generates one or more application-specific instructions to interact with the logic block 126 derived from the HDL code 206. The instruction may extend an instruction set provided by a CPU architecture (e.g., RISC-V) of the softcore processor. The compiler 118 may define the semantic for calling the specialized operation implemented by the logic block 126 in view of the HDL code 206. For example, the compiler 118 may emit pseudo-operations that tie them to new instructions. An example pseudo-operation included in the softcore processor assembler code 204 is represented below:

.if asm_supports_feature_XYZ
   .hdl< . . . describe HDL . . . >
   newinstr reg1, reg 2
.else
   . . . asm code to perform equivalent operations without new extended application-specific instruction . . .
.endif As depicted in the example, the semantic defined specifies the new application-specific instruction ("newinstr") includes a list of arguments including two registers ("reg1, reg2") where the logic block derived from HDL code 206 finds parameters to perform one or more operations on and where to deposit the result when the new instruction is executed. It should be understood that specifying arguments and receiving the result from the logic block may take on many other forms and the above example is provided for explanatory purposes. The generated code could perform other provided code sequences if there is not a specialized operation implemented by the HDL code 206 and a new instruction to enable interacting with the HDL code 206, as depicted by the "else" branch of the pseudo-operation.

The softcore assembler code 204 may include assembly language code that is input into the softcore assembler 120. The softcore assembler 120 may be configured to recognize pseudo-operations and emit the one or more instructions used to communicate with the logic block 126. The softcore assembler 120 may assemble the softcore assembler code 204 into softcore processor object code 208 (e.g., binary code) that is to be executed by the softcore processor 124 of the accelerator 108. In some embodiments, the softcore assembler 120 is also capable of identifying the portion of the softcore processor assembler code 204 that includes computationally intensive operations (e.g., core operations that are critical to performance) and generating the HDL code 206 for those portions.

The HDL code 206 may be input into the HDL compiler 122. In some embodiments, the HDL compiler 122 may access a softcore processor hardware description library 210 to identify bitstreams that are optionally already compiled for certain HDL code 206. That is, HDL code 206 may be synthesized and placed and routed (generate lookup tables and routing tables) once into a bitstream and then be made available in the softcore processor hardware description library 210. Thus, if the HDL compiler 122 receives HDL code 206 in the future that has already been compiled into a bitstream, the HDL compiler 122 may obtain the bitstream for the matching HDL code 206 from the softcore processor hardware description library 210 and save compute resources by avoiding recompiling the HDL code 206.

In some embodiments, the portion of the HDL code 206 related to the softcore processor implementation may be pre-compiled into the bitstream format (e.g., synthesized and placed and routed) and stored in the softcore processor hardware description library 210. The HDL code 206 related to the pre-compiled softcore processor implementation may be provided by a third-party.

In some embodiments, a first portion of the HDL code 206 may have already been compiled into a bitstream and added to the softcore processor hardware description library 210, and a second portion of the HDL code 206 may lack a matching bitstream in the softcore processor hardware description library 210. The HDL compiler 122 may generate a bitstream for the second portion of the HDL code 206 lacking the matching bitstream and link the generated bitstream with the bitstream already included in the softcore processor hardware description library 210 for the first portion to create a final bitstream.

The HDL compiler 122 may output the compiled bitstream 212. In some embodiments, any combination of the host object code 202, the softcore processor object code 208, and/or the bitstream 212 may be packaged into a binary 214 for the computer application associated with the source code 200. In some embodiments, the host object code 202, the softcore processor object code 208, and/or the bitstream 212 may not be packaged and each of them may be separated. The computer application binary 214 may be received by the OS kernel 116. The OS kernel 116 may separate the host object code 202, the softcore processor object code 208, and the bitstream 212 from the computer application binary 214. The OS kernel 116 may transmit the host object code 202 to the host processor 112A. The OS kernel 116 may transmit (e.g., uploads, downloads) the softcore processor object code 208 and the bitstream 212 to the accelerator 108. The softcore processor object code 208 may reside in a random access memory (RAM) of the accelerator 108 and the OS kernel 116 may initialize the accelerator 108 by transmitting the bitstream 212 to the accelerator 108. Transmitting the bitstream 212 may instantiate the softcore processor 124 and the logic blocks 126 to implement the circuit that performs the one or more specialized computationally intensive operations. The OS kernel 116 may instruct the accelerator to execute the softcore processor object code 208 on the softcore processor 124. The OS kernel 116 may instruct the host processor 112A to execute the host object code 202, which communicates and collaborates with the softcore processor object code 208 on the accelerator 108. The softcore processor object code 208 may execute the one or more application-specific instructions to interact with the logic block 126 to perform the specialized operation. The logic block 126 may return a result to the softcore processor 124 executing the softcore processor object code 208.

Figure 3:
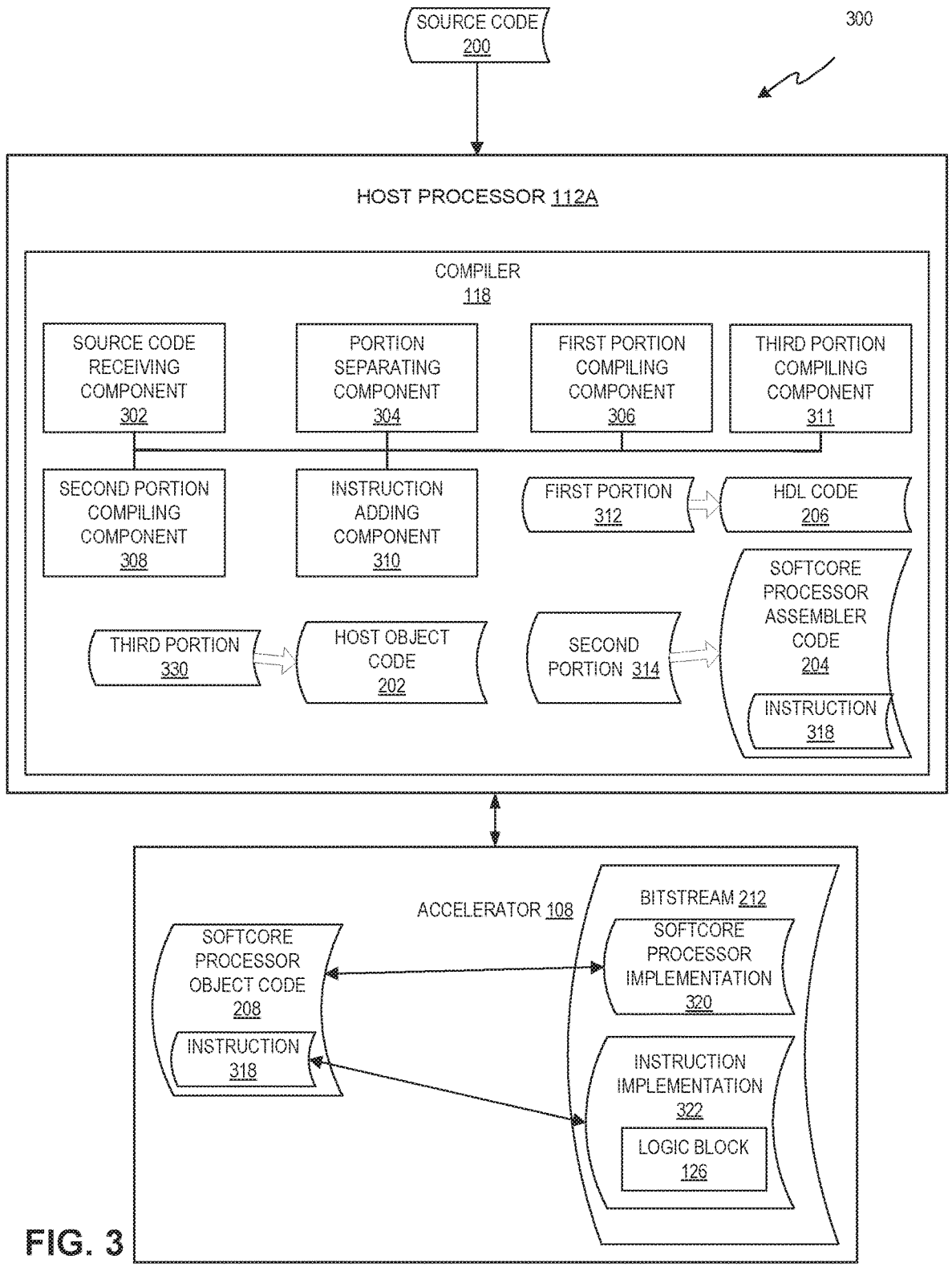
FIG. 3 depicts a block diagram of example host computing system operatively coupled to an accelerator, in accordance with one or more aspects of the present disclosure.

FIG. 3 depicts a block diagram of example host computing system 300 operatively coupled to an accelerator 108, in accordance with one or more aspects of the present disclosure. Host computing system 300 may be the same or similar to host computing system 102A or 102N of FIG. 1 and may include one or more processing devices, such as any of host processors 112A-112N, and one or more memory devices. In the example shown, the accelerator 108 may be included within the host computing system 300 or may be located external to the host computing system 300 and operatively coupled to the host processor 112A via a network. The host processor 112A may execute a compiler 118 that includes a source code receiving component 302, a portion separating component 304, a first portion compiling component 306, a second portion compiling component 308, an instruction adding component 310, and a third portion compiling component 311.

Source code receiving component 302 may enable the host processor 112A executing the compiler 118 to receive, by a compiler of the host computing system 300, the source code 200 for a computer application. The source code 200 may be written in any suitable programming language (e.g., C, C++, Fortran).

Portion separating component 304 may enable the host processor 112A executing the compiler 118 to separate a first portion 312 of the source code 200 and a second portion 314 of the source code 200 that are to be compiled for transmission to the accelerator 108 operatively coupled to the host computing system 300. In some embodiments, separating the first portion 312 of the source code 200 and the second portion 314 of the source code 200 may include identifying first information (e.g., annotations) included in the source code 200 that indicates the first portion 312 is to be compiled for transmission to the accelerator 108, and identifying second information included in the source code 200 that indicates the second portion 314 is to be compiled for transmission to the accelerator to be executed on a softcore processor by the accelerator 108. In some embodiments, separating the first portion 312 of the source code 200 and the second portion 314 of the source code 200 may include the compiler 118 determining that the first portion 312 and the second portion 314 satisfy one or more criteria for acceleration by being compiled for transmission to the accelerator 108.

In some embodiments, the source code 200 may be separated into a third portion that is to be compiled for execution by the host computing system 300. The third portion of the source code 200 may be identified by one or more annotations that indicate that the third portion is to be compiled by the compiler 118 for execution by the host computing system 300. In some embodiments, the third portion of the source code 200 may be identified to be compiled for execution by the host computing system 300 because it lacks information indicating that the third portion is to be accelerated. In some embodiments, the entire source code 200 may be compiled by the compiler 118 to generate host object code.

First portion compiling component 306 may enable the host processor 112A executing the compiler 118 to compile the first portion 312 of the source code 200 to generate HDL code 206. The HDL code 206 may include one or more specialized operations that are computationally intensive and/or critical to performance of the computer application and/or host computing system 300. A logic block 126 is to be generated on the accelerator 108 in view of the HDL code 206. For example, the HDL code 206 is translated into a bitstream 212 and is transmitted to the accelerator 108. Transmitting the bitstream 212 to the accelerator 108 may instantiate the logic block that performs the specialized operation defined by the HDL code 206.

Second portion compiling component 308 may enable the host processor 112A executing the compiler 118 to compile the second portion 314 of the source code 200 to generate softcore processor code 316 (e.g., softcore processor assembler code or softcore processor object code) to be executed by a softcore processor on the accelerator.

Instruction adding component 310 may enable the host processor 112A executing the compiler 118 to add one or more instructions 318 to the softcore processor code (e.g., softcore processor assembler code 204) to interact with the logic block 126 during execution of the softcore processor code (e.g., softcore processor object code 208) and the logic block 126. The instructions may be dynamically generated on the fly during compilation of the second portion 314 of the source code 200. As depicted, the softcore processor code (e.g., softcore processor object code 208) including the instructions 318 and the bitstream 212 may be transmitted to the accelerator 108. The bitstream 212 may include binary code representing the softcore processor implementation 320 that causes instantiation of the softcore processor running the softcore processor code 316, and binary code representing an instruction implementation 322 that causes instantiation of the logic block 126 that performs a specialized operation defined by the HDL code 206.

Third portion compiling component 311 may enable the host processor 112A executing the compiler 118 to compile a third portion 330 of the source code 200 that is not to be compiled for execution by the accelerator 108. The third portion 330 may be compiled for execution by the host processor. In some embodiments, the processing device executing the compiler 118 may separate the third portion 330 of the source code 200 that is to be compiled for execution by the host computing system 300 by identifying one or more annotations included in the source code 200 that indicate the third portion 330 of the source code is to be compiled for execution by the host computing system 300. In some embodiments, the third portion 330 may be identified if no annotations were associated with the third portion 330 that indicate that the third portion 330 is to be compiled for execution by the accelerator 108. The compiler 118 may generate host object code 202 for the third portion 330 of the source code 200.

Figure 4:
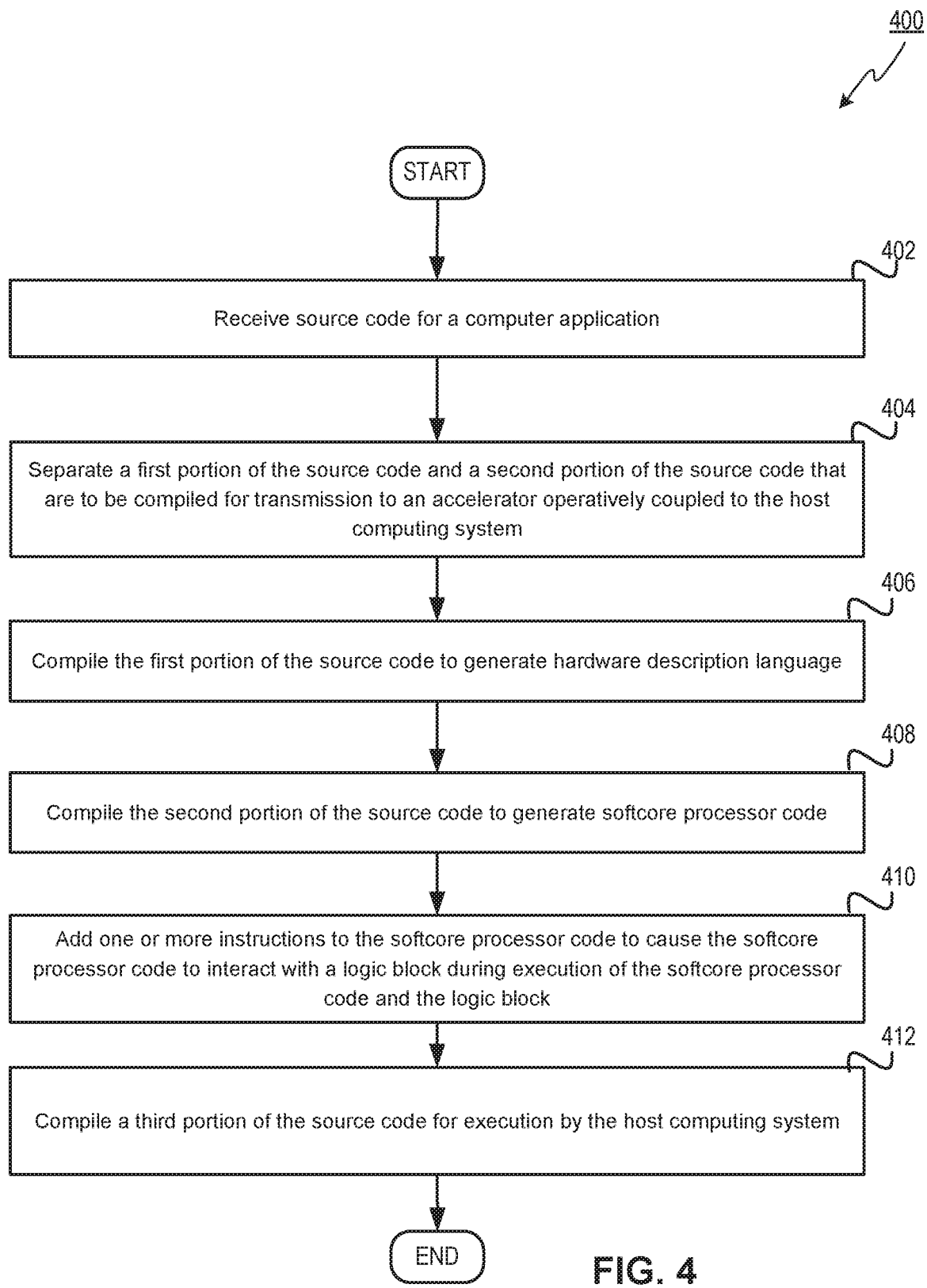
FIG. 4 depicts a flow diagram of an example method for a compiler, in accordance with one or more aspects of the present disclosure.

FIG. 4 depicts a flow diagram of an example method 400 for a compiler, in accordance with one or more aspects of the present disclosure. Method 400 and each of its individual functions, routines, subroutines, or operations may be performed by one or more processors of a computer device executing the method. In certain implementations, method 400 may be performed by a single processing thread of a guest operating system. Alternatively, method 400 may be performed by two or more processing threads executing on the computer device and each thread may execute one or more individual functions, routines, subroutines, or operations of the method. In an illustrative example, the processing threads implementing method 400 may be synchronized (e.g., using critical sections, semaphores, and/or other thread synchronization mechanisms). Alternatively, the processes implementing method 400 may be executed asynchronously with respect to each other.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term "article of manufacture," as used herein, is intended to encompass a computer program accessible from any computer-readable device or storage media. In one implementation, method 400 may be performed by a processing device (e.g., host processor 112A-112N) of the host computing system 300 executing the compiler 118 and may begin at block 402.

At block 402, a processing device executing a compiler of the host computing system may receive source code for a computer application. The source code 200 may be written in any suitable programming language (e.g., C, C++, Fortran).

At block 404, the processing device may separate a first portion of the source code and a second portion of the source code that are to be compiled for transmission to an accelerator (e.g., FPGA, GPGPU, etc.) operatively coupled to the host computing system. In some embodiments, the first portion of the source code may include one or more first operations that are more computationally intensive than one or more second operations included in the second portion of the source code. In some embodiments, separating the first portion of the source code and the second portion of the source code may include identifying first information (e.g., annotations) included in the source code that indicates the first portion is to be compiled for transmission to the accelerator. The first information may indicate that the first portion is critical to performance and that the first portion is to be compiled into HDL code. Further, separating the first portion of the source code and the second portion of the source code made include identifying second information included in the source code 200 that indicates the second portion is to be compiled for transmission to the accelerator to be executed on a softcore processor by the accelerator but is not performance sensitive enough to be compiled to HDL code. In some embodiments, separating the first portion of the source code and the second portion of the source code may include the compiler analyzing the source code as a whole (e.g., each portion of the source code) to determine that a first portion and a second portion satisfy one or more criteria for acceleration by being compiled for transmission to the accelerator. After dynamically determining the first and second portion are to be accelerated, the compiler may treat the first portion and second portion appropriately, as described herein.

The one or more criteria may be satisfied based on results of performing optimizations and/or simulations on operations in the portions of the source code during compilation, identifying certain types (e.g., complex iterative loops) of operations in the source code during compilation, or the like. For example, the compiler may perform an optimization and/or simulation on operations in the portions during compilation and determine that the operations are to be compiled for transmission to the accelerator if performance of the operations can be enhanced by a threshold amount (e.g., satisfying a criterion) by being executed on the accelerator as opposed to the host processor of the host computing system. Additionally, the compiler may determine how long each portion of the source code will take to execute and if the simulated execution time for any portion is above a threshold amount (e.g., satisfying a criterion), then the compiler may determine that those portions are to be compiled for transmission to the accelerator. The portions of the source code to be compiled for transmission to the accelerator may be referred to as kernels herein.

At block 406, the processing device may compile the first portion of the source code to generate hardware description language (HDL) code. The first portion of the source code may include one or more specialized operations (e.g., core operations) that are computationally intensive and/or critical to performance of the computer application and/or processing device. The annotations in the source code may further specify that the first portion includes the specialized operations and HDL code is to be generated for transmission to the accelerator. In some embodiments, after performing the simulations and/or optimizations, the compiler may determine that the first portion includes the specialized operations. The HDL code is to be input into the HDL compiler for compilation into the representation of hardware logic (e.g., bitstream). The HDL code may also include a portion for the softcore processor to enable softcore processor object to be executed by the softcore processor code to interact with a logic block instantiated in view of the HDL code.

In some embodiments, the representation of hardware logic is to be transmitted to the accelerator, which causes the logic block to be instantiated on the accelerator in view of the HDL code 206. Further, the transmission of the representation of the hardware logic may cause the softcore processor to be instantiated on the accelerator.

At block 408, the processing device may compile the second portion of the source code to generate softcore processor code. The softcore processor code may include non-computationally intensive operations, such as administrative operations and/or I/O operations. In some embodiments, the softcore processor code may be the softcore processor assembler code 204 (e.g., assembly code) that is to be input into the softcore assembler. The softcore processor assembler code may be assembled by the softcore assembler into the softcore processor object code 208. The softcore processor code (e.g., softcore processor object code) may be transmitted to the accelerator to be stored in a memory of the accelerator and to be executed by the softcore processor. The softcore processor represents a customized processor that is optimized for the computer application based on the added one or more instructions that interacts with the logic block generated in view of the HDL code.

At block 410, the processing device may add one or more instructions to the softcore processor code (e.g., softcore processor assembler code) to cause the softcore processor code (e.g., softcore processor object code) to interact with the logic block generated in view of the HDL code 206 during execution of the softcore processor code (e.g., softcore processor object code) possibly using the logic block 126. Adding the instruction(s) to the softcore processor code (e.g., softcore processor assembler code) may include defining a semantic for using the instruction in the softcore processor code (e.g., softcore processor assembler code). The processing device executing the compiler may generate the instruction for the softcore processor code during compilation of the second portion of the source code by extending an instruction provided by a CPU architecture implemented by a portion of a representation of hardware logic generated in view of the hardware description language code for a softcore processor. The portion of the representation of hardware logic may be associated with where the implementation of the new instruction or change of an existing instruction occurs. The instruction may alternatively be a new, application-specific instruction custom tailored for one or more operations of the computer application that are to be performed by the logic block. The instruction may cause the softcore processor code (e.g., softcore processor object code) to demand an operation be performed by the logic block 126, receive a result from the operation performed by the logic block 126, by storing the result in one or more registers or memory locations associated with a softcore processor implemented by the by a portion of a representation of hardware logic generated in view of the hardware description language code for the softcore processor.

In some embodiments, the processing device executing the compiler may receive second source code for a second computer application. The processing device executing the compiler may separate another first portion of the second source code and another second portion of the second source code that are to be compiled for transmission to the accelerator operatively coupled to the host computing system. The processing device executing the compiler may compile the another first portion of the second source code to generate second hardware description language code, where the second hardware description language code is used to generate a second logic block on the accelerator. The processing device may also compile the another second portion of the second source code to generate second softcore processor code, and add one or more second instructions to the second softcore processor code to cause the second softcore processor code to interact with the second logic block during execution of the second softcore processor code and the second logic block. The second one or more instructions may be different than the one or more instructions added at block 410. In some embodiments, the second one or more instructions may be the same as the one or more instructions added at block 410.

The instructions may not be persistent and different instructions may be generated for different source code during compilation on the fly. Further, different instructions may be generated for the same source code if the compiler performs different simulations and/or optimizations and determines that different portions of the source code should be implemented in HDL code. The disclosed embodiments provide a flexible framework to reduce the amount of source code that is translated into HDL code, thereby enhancing the HDL compilation process, while also providing extension of instruction sets of softcore processor cores to be able to interact with the logic blocks generated in view of the HDL code for specialized functions.

At block 412, the processing device executing the compiler may compile a third portion of the source code for execution by the host computing system (e.g., host processor). In some embodiments, the processing device executing the compiler may separate the third portion of the source code that is to be compiled for execution by the host computing system by identifying one or more annotations included in the source code that indicate the third portion of the source code is to be compiled for execution by the host computing system. In some embodiments, the third portion may be identified if no annotations were associated with the third portion that indicate that the third portion is to be compiled for transmission to the accelerator. The compiler may generate host object code for the third portion of the source code.

Figure 5:
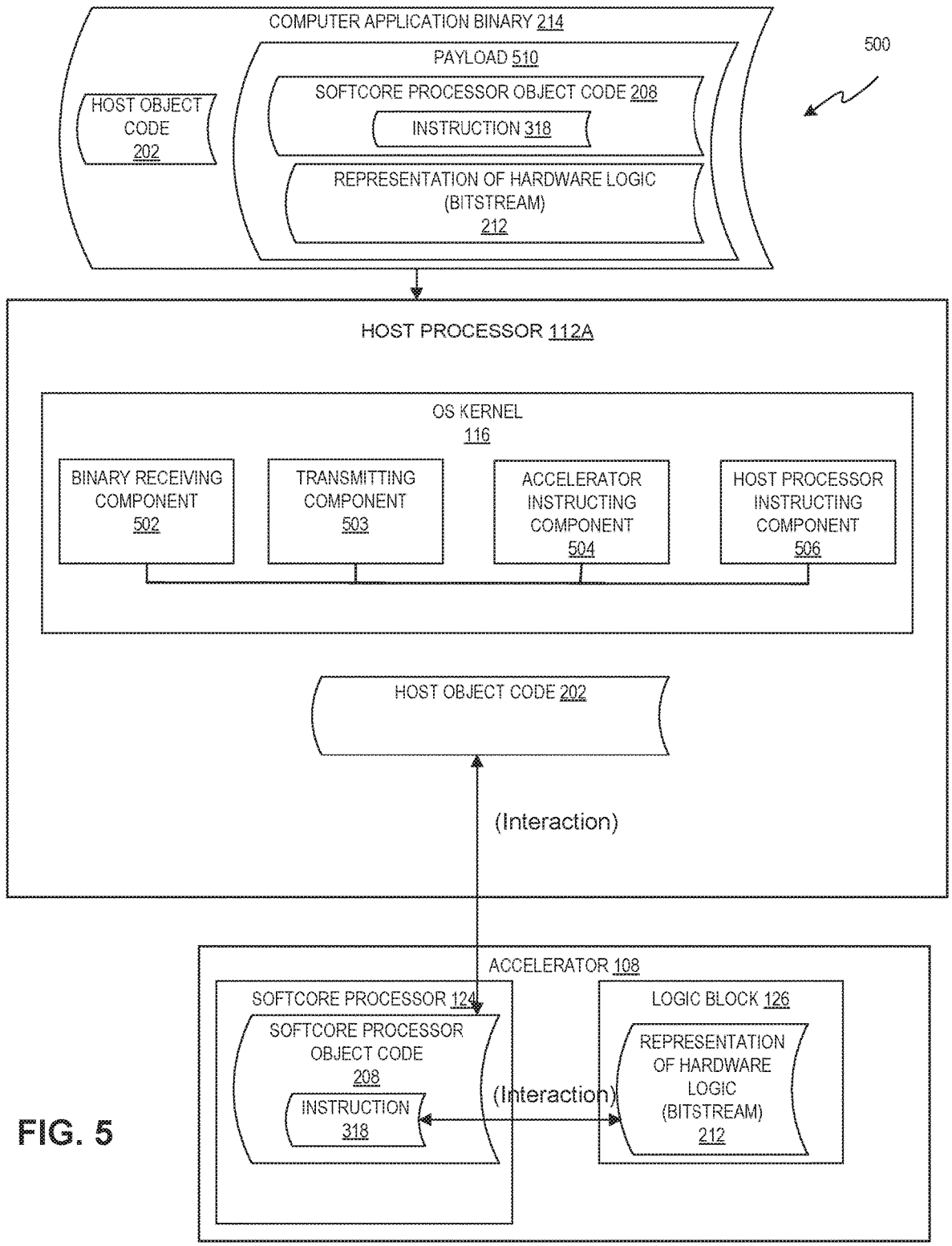
FIG. 5 depicts a block diagram of another example host computing system operatively coupled to an accelerator, in accordance with one or more aspects of the present disclosure.

FIG. 5 depicts a block diagram of another example host computing system 500 operatively coupled to an accelerator 108, in accordance with one or more aspects of the present disclosure. Host computing system 500 may be the same or similar to host computing system 102A or 102N of FIG. 1 and may include one or more processing devices, such as any of host processors 112A-112N, and one or more memory devices. In the example shown, the accelerator 108 may be included within the host computing system 500 or may be located external to the host computing system 500 and operatively coupled to the host processor 112A via a network. The host processor 112A may execute an OS kernel 116 that includes a binary receiving component 502, a transmitting component 503, an accelerator instructing component 504, and a host processor instructing component 506.

Binary receiving component 502 may enable the host processor 112A executing the OS kernel 116 to receive a binary 214 for a computer application. The binary 214 may include host object code 202 to be executed by a host processor and a payload 510 to be executed by the accelerator 108 operatively coupled to the host processor (e.g., the depicted processing device). The payload 510 represents a portion of the computer application identified for acceleration and includes softcore processor object code 208 associated with the computer application and a representation of hardware logic (bitstream) 212 associated with the computer application. The softcore processor object code 208 may include one or more instructions 318 that enables interaction with the representation of hardware logic 212.

Transmitting component 503 may enable the host processor 112A executing the OS kernel 116 to transmit the softcore processor object code 208 and the representation of hardware logic (bitstream) 212 to the accelerator. Transmitting the representation of the hardware logic to the accelerator may cause a softcore processor 124 and a logic block 126 to be instantiated on the accelerator in view of the representation of hardware logic.

Accelerator instructing component 504 may enable the host processor 112A executing the OS kernel 116 to instruct the accelerator 108 to execute the softcore processor object code 208. The processing device may have separated the host object code 202 and the payload 510 from the binary 214, and transmitted the payload 510 including the softcore processor object code 208 and the representation of the hardware logic 212 to the accelerator 108.

Host processor instructing component 506 may enable the host processor 112A executing the OS kernel 116 to instruct the host processor to execute the host object code 202 that includes an operation call that causes communication with the accelerator executing the softcore processor object code 208. Further, as described above, the softcore processor object code 208 includes the one or more instructions 318 to interact with the logic block 126.

Figure 6:
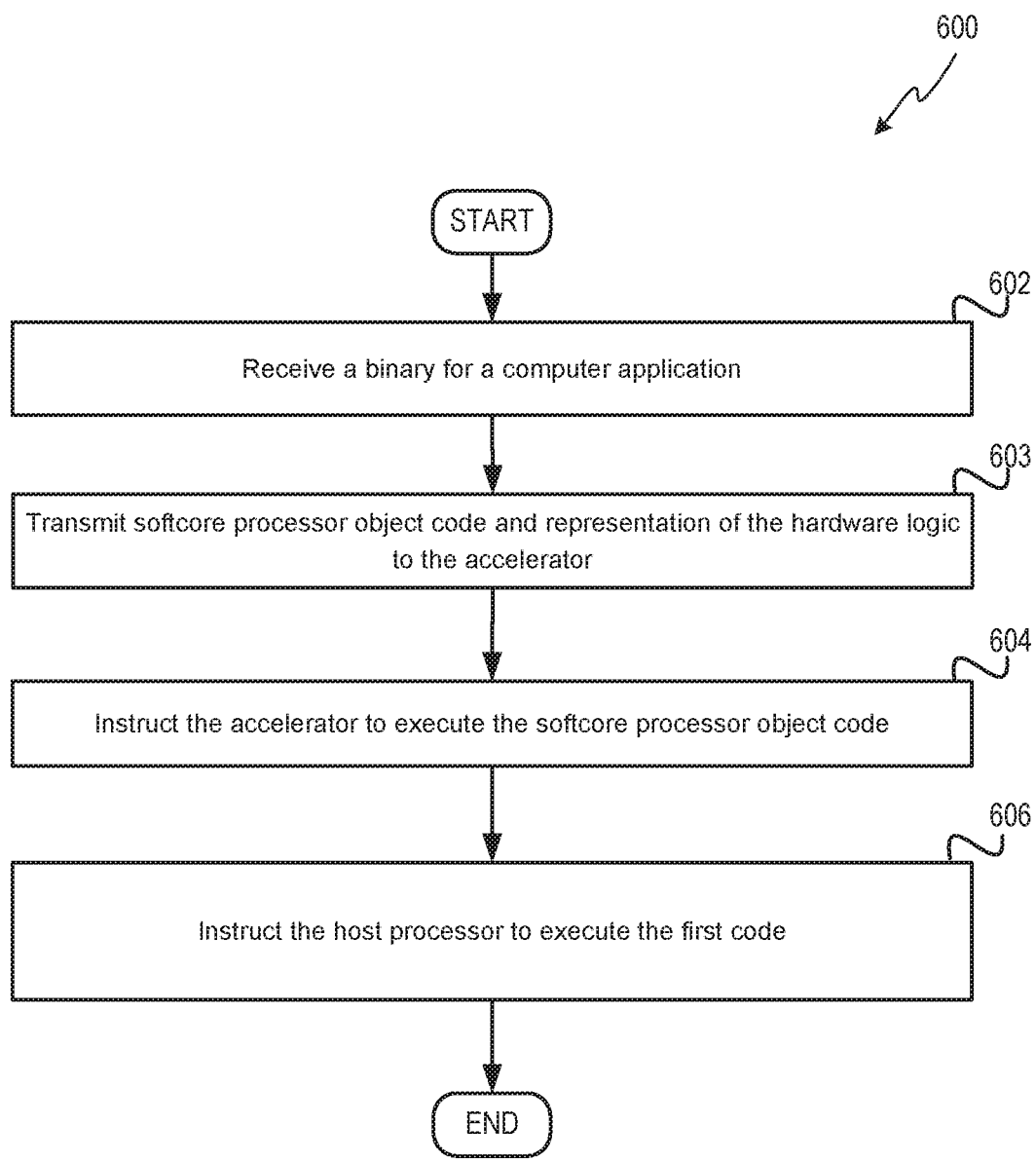
FIG. 6 depicts a flow diagram of an example method for an operating system kernel, in accordance with one or more aspects of the present disclosure.

FIG. 6 depicts a flow diagram of an example method 600 for an operating system kernel, in accordance with one or more aspects of the present disclosure. Method 600 may be similar to method 400 and may be performed in the same or a similar manner as described above in regards to FIG. 4. Method 600 may be performed by a processing device (e.g., host processor 112A-112N) of the host computing system 300 executing the operating system kernel 116 and may begin at block 602.

At block 602, a processing device executing the operating system kernel of the host computing system may receive a binary for a computer application. The binary may include host object code 202 to be executed by a host processor. The host object code is binary code suitable for execution by the type of architecture (e.g., x86) used by the host processor to perform the operations of the source code that were not identified for acceleration.

The binary may also include payload 510 to be transmitted to an accelerator (e.g., FPGA, GPGPU, etc.) operatively coupled to the host processor. The payload may represent a portion of the source code of the computer application identified for acceleration. The payload may include softcore processor object code associated with the computer application and a representation of hardware logic associated with the computer application. The softcore processor object code may include binary code suitable for execution by the type of architecture (e.g., RISC-V) used by the softcore processor to perform the non-computationally intensive operations (e.g., administrative operations, I/O operations, etc.) of the source code identified for acceleration. The representation of hardware logic may include a bitstream (e.g., binary code) suitable for programming the accelerator to behave as an embedded hardware platform (e.g., circuit) that performs the specialized computationally intensive operations of the source code identified for acceleration during compilation of the source code associated with the computer application. The representation of the hardware logic may include a portion for the softcore processor implementation and a portion for the one or more instructions (e.g., logic block) associated with the computationally intensive operations. The representation of the hardware logic may have been translated from hardware description language code generated for the new one or more instructions during compilation. The hardware description language code for the one or more instructions may connect a softcore processor executing the softcore processor object code with the logic block on the accelerator and is used when the one or more instructions in the softcore processor object code are executed. The processing device executing the OS kernel may extract the host object code, the softcore processor object code, and the representation of the hardware logic from the binary.

At block 603, a processing device executing the operating system kernel of the host computing system may transmit the softcore processor object code and the representation of hardware logic to the accelerator. Transmitting the representation of the hardware logic to the accelerator may cause a softcore processor and a logic block to be instantiated on the accelerator in view of the representation of hardware logic.

At block 604, the processing device executing the OS kernel may instruct the accelerator to execute the softcore processor object code. The OS kernel may upload the softcore processor object code to reside in the RAM of the accelerator.

At block 606, the processing device may instruct the host processor to execute the host object code. The host object code may include an operation call to an OS kernel driver that causes communication with the accelerator executing the softcore processor object code. The host object code may communicate and collaborate with the softcore processor object code running on the accelerator. The softcore processor object code may include one or more instructions to interact with the logic block. The instructions may be an extension of an instruction provided by the CPU architecture (e.g., RISC-V) implemented by the softcore processor. The instructions included in the softcore processor object code to interact with the logic block may have been generated and added to the softcore processor object code during compilation. The instructions may cause an operation to be performed by the logic block implementing the representation of hardware logic. A result of the operation performed by the logic block may be returned.

Figure 7:
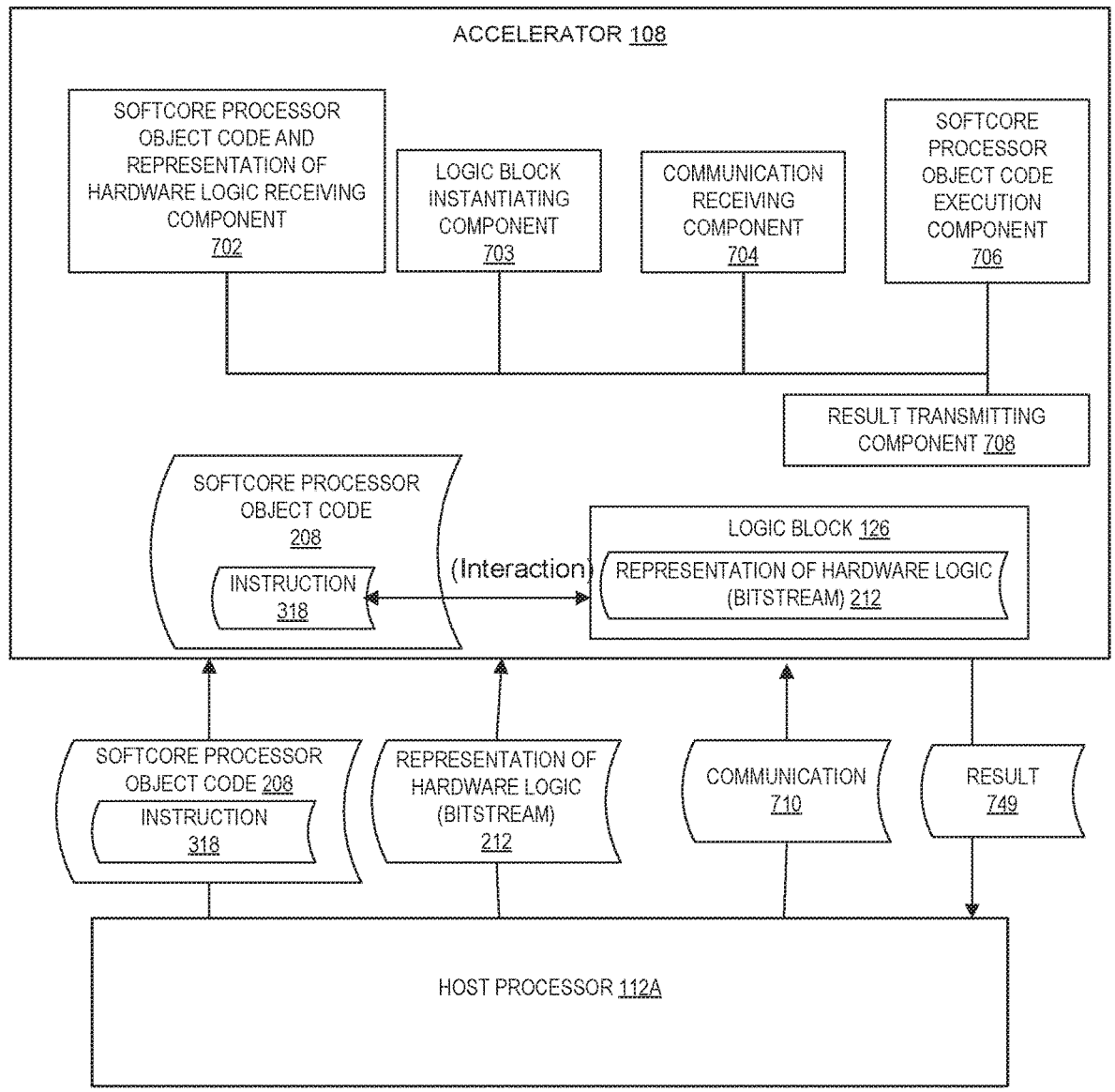
FIG. 7 depicts a block diagram of an accelerator operatively coupled to a host processor, in accordance with one or more aspects of the present disclosure.

FIG. 7 depicts a block diagram of an accelerator 108 operatively coupled to a host processor 112A, in accordance with one or more aspects of the present disclosure. The accelerator 108 may be the same as the accelerator 108 in FIG. 1 or the same as the accelerator 160 in FIG. 1. That is, the accelerator 108 may be located within a host computing system 102A like accelerator 108 or may be standalone like accelerator 160 and operatively coupled to a host computing system 102A-102N via a network. The accelerator 108 may include one or more processing devices (not depicted) and one or more memory devices (not depicted), such as RAM. The accelerator 108 may execute a softcore processor object code and representation of hardware logic receiving component 702, a logic block generating component 703, a communication receiving component 704, a softcore processor object code execution component 706, and a result transmitting component 708.

Softcore processor object code and representation of hardware logic receiving component 702 may enable the accelerator 108 to receive softcore processor object code 208 and a representation of hardware logic 212 from the host processor 112A. The softcore processor object code 208 and the representation of the hardware logic 212 may be associated with respective portions of a computer application that were identified for acceleration. The softcore processor object code 208 may include one or more instructions 318 that enables interacting with the logic block generated in view of the representation of hardware logic 212.

Logic block instantiating component 703 may enable the accelerator 108 to instantiate a logic block in view of the representation of the hardware logic. In some embodiments, the logic block is instantiated in response to the accelerator receiving the representation of the hardware logic.

Communication receiving component 704 may enable the accelerator 108 to receive a communication 710 to execute the softcore processor object code 208 from the host processor 112A. The host processor 112A may be executing host object code associated with the computer application and executed an operation call to an OS kernel driver to communicate with the accelerator responsive to encountering the portions of the computer application that were identified for acceleration on the accelerator 108.

Softcore processor object code execution component 706 may enable the accelerator 108 to execute the softcore processor object code 208. The softcore processor object code 208 includes the one or more instructions 318 to interact with the logic block to perform an operation. The result of the operation may be returned by the logic block to the softcore processor object code 208.

Result transmitting component 708 may enable the accelerator 108 to transmit the result of the operation performed by the logic block to the host processor 112A. For example, the softcore processor object code may perform one or more computations that are encoded in the softcore processor object code 208, and the one or more computations may use the result of the operation performed by the logic block. The host processor 112A may perform additional operations using the result or output the result to a display.

Figure 8:
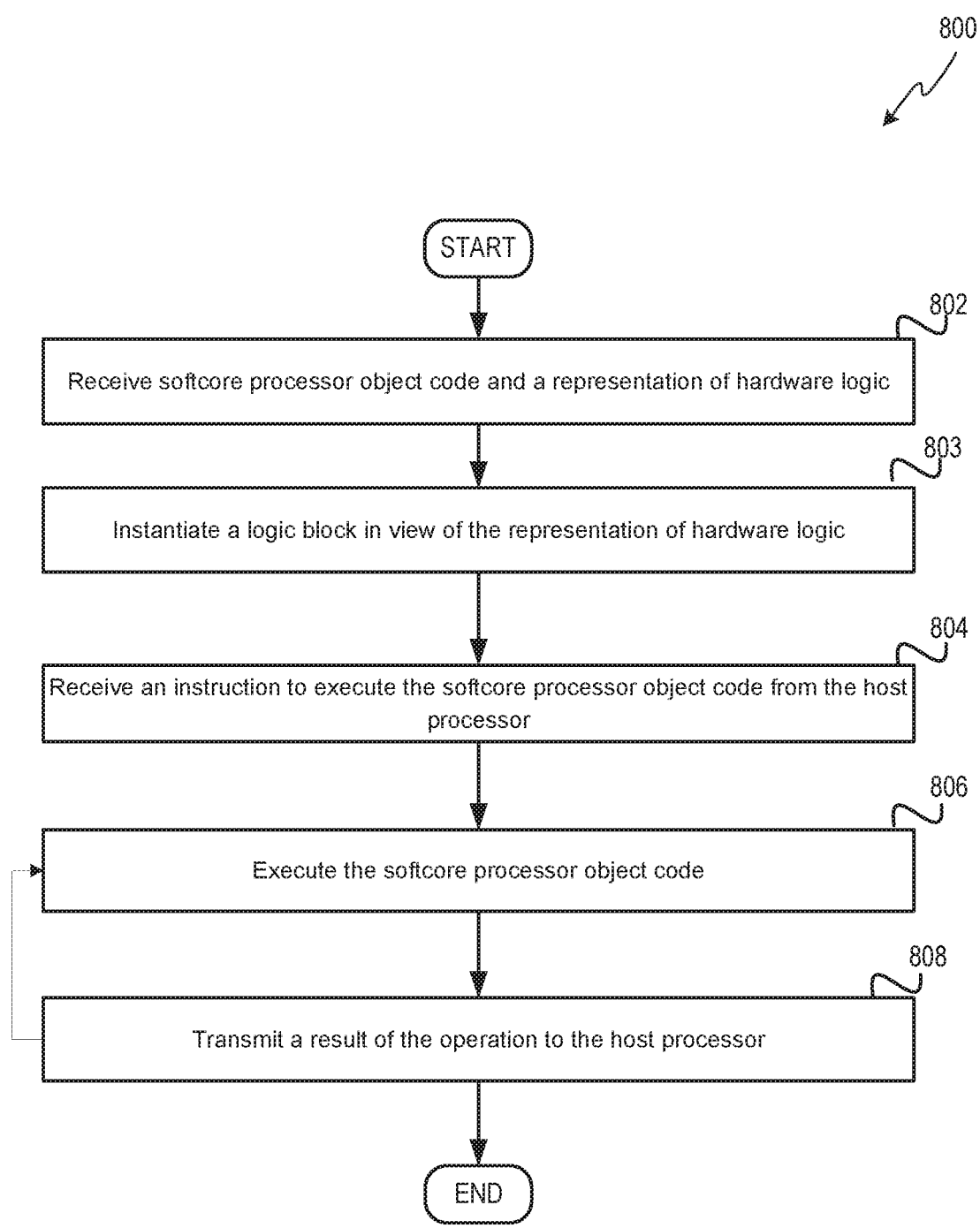
FIG. 8 depicts a flow diagram of an example method for an accelerator, in accordance with one or more aspects of the present disclosure.

FIG. 8 depicts a flow diagram of an example method 800 for an accelerator, in accordance with one or more aspects of the present disclosure. Method 800 may be similar to method 400 and may be performed in the same or a similar manner as described above in regards to FIG. 4. Method 800 may be performed by an accelerator 108 operatively coupled to the host computing system 102A and may begin at block 802.

At block 802, the accelerator may receive softcore processor object code 208 and a representation of hardware logic 212. The softcore processor object code and the representation of the hardware logic may be associated with respective portions of a computer application that were identified for acceleration. The softcore processor object code may include one or more instructions that enable interacting with a logic block generated in view of the representation of hardware logic. The representation of hardware logic may include a bitstream including the operation and the operation is more computationally intensive than operations included in the softcore processor object code.

At block 803, the accelerator may instantiate a logic block in view of the representation of hardware logic. The accelerator may instantiate the logic block in response to receiving the representation of hardware logic.

At block 804, the accelerator may receive a communication to execute the softcore processor object code from the host processor. The host processor may be executing host object code associated with the computer application and transmitted the communication responsive to encountering the portions of the computer application that were identified for acceleration on the accelerator.

At block 806, the accelerator may execute the softcore processor object code. The softcore processor object code may include the instructions to interact with the logic block generated from the representation of hardware logic to perform an operation. The instructions were generated on the fly and added to the softcore processor object code during compilation of source code associated with the computer application.

At block 808, the accelerator may transmit a result of the operation to the host processor. The host processor 112A may perform additional operations using the result or output the result to a display. The accelerator may return to block 806 from block 808 to execute the softcore processor object code again, as depicted by the back arrow. The accelerator may transmit (block 808) another result of the operation to the host processor after executing the softcore processor code again in block 806. This process of performing blocks 806 and 808 may be repeated by the accelerator as often as desired.

FIG. 9 depicts a block diagram of a computer system operating in accordance with one or more aspects of the present disclosure. In various illustrative examples, computer system 900 may correspond to host computing system 102A-102N of FIG. 1, accelerator 118 of FIGS. 1, 3, 5, and/or 7, the host computing system 300 of FIG. 3, the host computing system 500 of FIG. 5, or the host processor 112A of FIG. 7. The computer system may be included within a data center that supports virtualization. Virtualization within a data center results in a physical system being virtualized using virtual machines to consolidate the data center infrastructure and increase operational efficiencies. A virtual machine (VM) may be a program-based emulation of computer hardware. For example, the VM may operate based on computer architecture and functions of computer hardware resources associated with hard disks or other such memory. The VM may emulate a physical computing environment, but requests for a hard disk or memory may be managed by a virtualization layer of a computing device to translate these requests to the underlying physical computing hardware resources. This type of virtualization results in multiple VMs sharing physical resources.

In certain implementations, computer system 900 may be connected (e.g., via a network, such as a Local Area Network (LAN), an intranet, an extranet, or the Internet) to other computer systems. Computer system 900 may operate in the capacity of a server or a client computer in a client-server environment, or as a peer computer in a peer-to-peer or distributed network environment. Computer system 900 may be provided by a personal computer (PC), a tablet PC, a set-top box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 900 may include a processing device 902, a volatile memory 904 (e.g., random access memory (RAM)), a non-volatile memory 906 (e.g., read-only memory (ROM) or electrically-erasable programmable ROM (EEPROM)), and a data storage device 916, which may communicate with each other via a bus 908.

Processing device 902 may be provided by one or more processors such as a general purpose processor (such as, for example, a complex instruction set computing (CISC) microprocessor, a reduced instruction set computing (RISC) microprocessor, a very long instruction word (VLIW) microprocessor, a microprocessor implementing other types of instruction sets, or a microprocessor implementing a combination of types of instruction sets) or a specialized processor (such as, for example, an application specific integrated circuit (ASIC), a field programmable gate array (FPGA), a digital signal processor (DSP), or a network processor).

Computer system 900 may further include a network interface device 922. Computer system 900 also may include a video display unit 910 (e.g., an LCD), an alphanumeric input device 912 (e.g., a keyboard), a cursor control device 914 (e.g., a mouse), and a signal generation device 920.

Data storage device 916 may include a non-transitory computer-readable storage medium 924 on which may store instructions 926 encoding any one or more of the methods or functions described herein, including instructions for implementing methods 400, 600, and/or 800 and for implementing the compiler 118, the operating system kernel 116, the softcore assembler 120, the HDL compiler 122, the softcore processor 124 and/or 162, logic blocks 126 and/or 164, softcore processor code 316, softcore processor object code 208, host object code 202, HDL code 206, and/or bitstream 212.

Instructions 926 may also reside, completely or partially, within volatile memory 904 and/or within processing device 902 during execution thereof by computer system 900, hence, volatile memory 904, and processing device 902 may also constitute machine-readable storage media.

While computer-readable storage medium 924 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer and cause the computer to perform any one or more of the methods described herein. The term "computer-readable storage medium" shall include, but not be limited to, solid-state memories, optical media, and magnetic media.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware resources. Further, the methods, components, and features may be implemented in any combination of hardware resources and computer program components, or in computer programs.

Unless specifically stated otherwise, terms such as "initiating," "transmitting," "receiving," "analyzing," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may comprise a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform methods and/or each of its individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

Other computer system designs and configurations may also be suitable to implement the systems and methods described herein. The following examples illustrate various implementations in accordance with one or more aspects of the present disclosure.

Example 1 is a method comprising: receiving, by a compiler of a host computing system, source code for a computer application; separating a first portion of the source code and a second portion of the source code that are to be compiled for transmission to an accelerator operatively coupled to the host computing system; compiling the first portion of the source code to generate hardware description language code, wherein a logic block is to be generated on the accelerator in view of the hardware description language code; compiling the second portion of the source code to generate softcore processor code; and adding one or more instructions to the softcore processor code to cause the softcore processor code to interact with the logic block during execution of the softcore processor code and the logic block.

Example 2 is the method of Example 1, wherein separating the first portion of the source code and the second portion of the source code further comprises: identifying first information included in the source code that indicates the first portion is to be compiled for transmission to the accelerator; and identifying second information included in the source code that indicates the second portion is to be compiled for transmission to the accelerator to be executed on a softcore processor by the accelerator.

Example 3 is the method of Example 1, further comprising: separating a third portion of the source code that is to be compiled for execution by the host computing system by identifying one or more annotations included in the source code that indicate the third portion of the source code is to be compiled for execution by the host computing system.

Example 4 is the method of Example 1, wherein separating the first portion of the source code and the second portion of the source code further comprises: determining that the first portion of the source code and the second portion of the source code satisfy one or more criteria for acceleration by being compiled for transmission to the accelerator.

Example 5 is the method of Example 1, wherein the first portion of the source code includes one or more first operations that are more computationally intensive than one or more second operations included in the second portion of the source code.

Example 6 is the method of Example 1, further comprising: generating the one or more instructions for the softcore processor code during compilation of the second portion of the source code by extending one or more instructions provided by a central processing unit architecture for a softcore processor implemented by a portion of a representation of hardware logic generated in view of a portion of the hardware description language code for the softcore processor.

Example 7 is the method of Example 6, wherein the one or more instructions are application-specific instructions custom tailored for one or more operations of the computer application that are to be performed by the logic block generated in view of the hardware description language code.

Example 8 is the method of Example 1, wherein the one or more instructions causes the softcore processor code to demand an operation be performed by the logic block, receive a result from the operation performed by the logic block, and store the result in a register or memory associated with a softcore processor implemented by a portion of a representation of hardware logic generated in view of a portion of the hardware description language code for the softcore processor.

Example 9 is the method of Example 1, further comprising: receiving, by the compiler of the host computing system, second source code for a second computer application; separating another first portion of the second source code and another second portion of the second source code that are to be compiled for transmission to the accelerator operatively coupled to the host computing system; compiling the another first portion of the second source code to generate second hardware description language code, wherein the second hardware description language code is used to generate a second logic block on the accelerator; compiling the another second portion of the second source code to generate second softcore processor code; and adding one or more second instructions to the second softcore processor code to cause the second softcore processor code to interact with the second logic block during execution of the second softcore processor code and the second logic block, wherein the second instruction is different than the instruction.

Example 10 is the method of Example 1, wherein a softcore processor is instantiated on the accelerator to execute the softcore processor code, wherein the softcore processor represents a customized processor that is optimized for the computer application in view of the added one or more instructions that interact with the logic block.

Example 11 is the method of Example 1, wherein adding the one or more instructions to the softcore processor code further comprises: defining a semantic for using the one or more instructions in the softcore processor code.

Example 12 is the method of Example 1, wherein the accelerator comprises a field programmable gate array or a general purpose graphic processing unit.

Example 13 is a system comprising: a memory device; and a processing device operatively coupled to the memory device, the processing device to: receive, by an operating system kernel, a binary for a computer application, the binary comprising host object code to be executed by a host processor and a payload to be transmitted to an accelerator operatively coupled to the host processor, wherein the payload represents a portion of the computer application identified for acceleration and comprises softcore processor object code associated with the computer application and a representation of hardware logic associated with the computer application; transmit the softcore processor object code and the representation of hardware logic to the accelerator, wherein transmitting the representation of the hardware logic to the accelerator cause a logic block to be generated on the accelerator in view of the representation of the hardware logic; instruct the accelerator to execute the softcore processor object code; and instruct the host processor to execute the first code, wherein the first code includes an operation call that causes communication with the accelerator executing the softcore processor object code, and the softcore processor object code includes one or more instructions to interact with the logic block.

Example 14 is the system of Example 13, wherein the processing device is further to extract the first code, the softcore processor object code, and the representation of the hardware logic.

Example 15 is the system of Example 13, wherein the one or more instructions included in the softcore processor object code to interact with the logic block were generated and added to the softcore processor object code during compilation.

Example 16 is the system of Example 13, wherein the representation of hardware logic comprises a bitstream that performs an operation when executed in the logic block on the accelerator, and wherein the operation was identified for acceleration during compilation of source code associated with the computer application.

Example 17 is the system of Example 13 wherein hardware description language code is generated for the one or more instructions during compilation, wherein the hardware description language code for the one or more instructions connects a softcore processor executing the softcore processor object code with the logic block and is used when the one or more instructions in the softcore processor object code are executed.

Example 18 is a method, comprising: receiving, by an accelerator operatively coupled to a host processor, softcore processor object code and a representation of hardware logic, wherein the softcore processor object code and the representation of hardware logic are associated with respective portions of a computer application that were identified for acceleration; generating a logic block in view of the representation of hardware logic; receiving, by the accelerator, a communication to execute the softcore processor object code from the host processor; executing the softcore processor object code, wherein the softcore processor object code includes one or more instructions to interact with the logic block to perform an operation; and transmitting a result of the operation to the host processor.

Example 19 is the method of Example 18, wherein the representation of the hardware logic comprises a bitstream including the operation and the operation is more computationally intensive than operations included in the softcore processor object code.

Example 20 is the method of Example 18, wherein the one or more instructions were generated and added to the softcore processor object code during compilation of source code associated with the computer application.

Example 21 is a non-tangible, computer-readable medium storing instructions that, when executed by a processing device, cause the processing device to: receive, by an operating system kernel, a binary for a computer application, the binary comprising first code to be executed by a host processor and second code to be executed by an accelerator operatively coupled to the host processor, wherein the second code represents a portion of the computer application identified for acceleration and comprises softcore processor object code associated with the computer application and a representation of hardware logic associated with the computer application; transmit the softcore processor object code and the representation of hardware logic to the accelerator; instruct the accelerator to execute the softcore processor object code and the representation of the hardware logic, wherein execution of the representation of the hardware logic generates a logic block; and instruct the host processor to execute the first code, wherein the first code includes an operation call that causes communication with the accelerator executing the softcore processor object code, and the softcore processor object code includes one or more instructions to interact with the logic block.

Example 22 is the computer-readable medium of Example 21, wherein the processing device is further to extract the first code, the softcore processor object code, and the representation of the hardware logic.

Example 23 is the computer-readable medium of Example 21, wherein the one or more instructions included in the softcore processor object code to interact with the logic block were generated and added to the softcore processor object code during compilation.

Example 24 is the computer-readable medium of Example 21, wherein the representation of hardware logic comprises a bitstream that performs an operation in the logic block when executed on the accelerator, and wherein the operation was identified for acceleration during compilation of source code associated with the computer application.

Example 25 is the computer-readable medium of Example 21, wherein the processing device is further to: receive, by the operating system kernel, a request to perform an operation of the softcore processor object code executing on the accelerator from the host processor in response to the host processor executing an operation call included in the first code to interact with the softcore processor object code; receiving a result from the accelerator in response to the accelerator executing an operation in the logic block that is called by the softcore processor object code using the one or more instructions; and transmitting the result to the host processor.

Example 26 is an apparatus comprising: means for receiving, by a compiler of a host computing system, source code for a computer application; means for separating a first portion of the source code and a second portion of the source code that are to be compiled for execution by an accelerator operatively coupled to the host computing system; means for compiling the first portion of the source code to generate hardware description language code, wherein the hardware description language code is to be used to generate a logic block on the accelerator; means for compiling the second portion of the source code to generate softcore processor code; and means for adding one or more instructions to the softcore processor code to cause the softcore processor code to interact with the logic block during execution of the softcore processor code and the logic block.

Example 27 is the apparatus of Example 26, wherein separating the first portion of the source code and the second portion of the source code further comprises: means for identifying first information included in the source code that indicates the first portion is to be compiled for execution by a softcore processor on the accelerator; and means for identifying second information included in the source code that indicates the second portion is to be compiled for execution by the accelerator.

Example 28 is the apparatus of Example 26, further comprising: means for identifying information included in the source code that indicates a third portion of the source code is to be compiled for execution by the host computing system; and means for separating a third portion of the source code that is to be compiled for execution by the host computing system by identifying one or more annotations included in the source code that indicate a third portion of the source code is to be compiled for execution by the host computing system.

Example 29 is the apparatus of Example 26, wherein separating the first portion of the source code and the second portion of the source code further comprises: means for determining that the first portion of the source code and the second portion of the source code satisfy one or more criteria for acceleration by being compiled for execution on the accelerator.

Example 30 is the apparatus of Example 26, wherein the second portion of the source code includes one or more first operations that are more computationally intensive than one or more second operations included in the first portion of the source code.

Example 31 is the apparatus of Example 26, further comprising: means for generating the one or more instructions for the softcore processor code during compilation of the second portion of the source code by extending one or more instructions provided by a CPU architecture implemented by the softcore processor code.

Example 32 is the apparatus of Example 31, wherein the one or more instructions are application-specific instructions custom tailored for one or more operations of the computer application that are to be performed by the logic block.

Example 33 is the apparatus of Example 26, wherein the instruction causes the softcore processor code to demand an operation be performed by the logic block, receive a result from the operation performed by the logic block, and store the result in a register or memory associated with a softcore processor implemented by the softcore processor code executing on the accelerator.

Example 34 is the apparatus of Example 26, further comprising: means for receiving, by the compiler of the host computing system, second source code for a second computer application; means for separating another first portion of the second source code and another second portion of the second source code that are to be compiled for execution by the accelerator operatively coupled to the host computing system; means for compiling the another first portion of the second source code to generate second hardware description language code, wherein the hardware description language code is to be used to generate a second logic block on the accelerator; means for compiling the another second portion of the second source code to generate second softcore processor code; and means for adding one or more second instructions to the second softcore processor code to cause the second softcore processor code to interact with the second logic block during execution of the second softcore processor code and the second logic block, wherein the second instruction is different than the instruction.

What is claimed is:

1. A method comprising:
receiving, by a compiler of a host computing system, source code for a computer application;
separating a first portion of the source code and a second portion of the source code that are to be compiled for transmission to an accelerator operatively coupled to the host computing system;
compiling the first portion of the source code to generate hardware description language code, wherein a logic block is to be instantiated on the accelerator in view of the hardware description language code;
compiling the second portion of the source code to generate softcore processor code; and
adding one or more instructions to the softcore processor code to cause the softcore processor code to interact with the logic block during execution of the softcore processor code and the logic block, wherein the one or more instructions are application-specific instructions customized for one or more operations of the computer application.

2. The method of claim 1, wherein separating the first portion of the source code and the second portion of the source code further comprises:
identifying first information included in the source code that indicates the first portion is to be compiled for transmission to the accelerator; and
identifying second information included in the source code that indicates the second portion is to be compiled for transmission to the accelerator to be executed on a softcore processor by the accelerator.

3. The method of claim 1, further comprising:
separating a third portion of the source code that is to be compiled for execution by the host computing system by identifying one or more annotations included in the source code that indicate the third portion of the source code is to be compiled by the host computing system.

4. The method of claim 1, wherein separating the first portion of the source code and the second portion of the source code further comprises:
determining that the first portion of the source code and the second portion of the source code satisfy one or more criteria for acceleration by being compiled for transmission to the accelerator.

5. The method of claim 1, wherein the first portion of the source code includes one or more first operations that are more computationally intensive than one or more second operations included in the second portion of the source code.

6. The method of claim 1, further comprising:
generating the one or more instructions for the softcore processor code during compilation of the second portion of the source code by extending one or more instructions provided by a central processing unit architecture for a softcore processor implemented by a portion of a representation of hardware logic generated in view of a portion of the hardware description language code for the softcore processor.

7. The method of claim 6, wherein the one or more instructions are application-specific instructions custom tailored for one or more operations of the computer application that are to be performed by the logic block generated in view of the hardware description language code.

8. The method of claim 1, wherein the one or more instructions cause the softcore processor code to demand an operation be performed by the logic block, receive a result from the operation performed by the logic block, by storing the result in a register or memory associated with a softcore processor implemented by a portion of a representation of hardware logic generated in view of a portion of the hardware description language code for the softcore processor.

9. The method of claim 1, further comprising:
receiving, by the compiler of the host computing system, second source code for a second computer application;
separating another first portion of the second source code and another second portion of the second source code that are to be compiled for transmission to the accelerator operatively coupled to the host computing system;
compiling the another first portion of the second source code to generate second hardware description language code, wherein a second logic block is to be generated on the accelerator in view of the second hardware description language code;
compiling the another second portion of the second source code to generate second softcore processor code; and
adding one or more second instructions to the second softcore processor code to cause the second softcore processor code to interact with the second logic block during execution of the second softcore processor code and the second logic block, wherein the one or more second instructions added to the second softcore processor code are are different than the one or more instructions added to the softcore processor code.

10. The method of claim 1, wherein a softcore processor is instantiated on the accelerator to execute the softcore processor code, wherein the softcore processor represents a customized processor that is optimized for the computer application in view of the added one or more instructions that interact with the logic block.

11. The method of claim 1, wherein adding the one or more instructions to the softcore processor code further comprises:
defining a semantic for using the one or more instructions in the softcore processor code.

12. The method of claim 1, wherein the accelerator comprises a field programmable gate array or a general purpose graphic processing unit.

13. A system comprising:
a memory device; and
a processing device operatively coupled to the memory device, the processing device to:
receive, by an operating system kernel, a binary for a computer application, the binary comprising host object code to be executed by a host processor and a payload to be transmitted to an accelerator operatively coupled to the host processor, wherein the payload represents a portion of the computer application identified for acceleration and comprises softcore processor object code associated with the computer application and a representation of hardware logic associated with the computer application;
transmit the softcore processor object code and the representation of hardware logic to the accelerator, wherein transmitting the representation of the hardware logic to the accelerator causes a logic block to be generated on the accelerator in view of the representation of hardware logic;
instruct the accelerator to execute the softcore processor object code; and instruct the host processor to execute the host object code, wherein the host object code includes an operation call that causes communication with the accelerator executing the softcore processor object code, and the softcore processor object code includes one or more instructions to interact with the logic block.

14. The system of claim 13, wherein the processing device is further to extract the host object code, the softcore processor object code, and the representation of the hardware logic.

15. The system of claim 13, wherein the one or more instructions included in the softcore processor object code to interact with the logic block were generated and added to the softcore processor object code during compilation.

16. The system of claim 13, wherein the representation of hardware logic comprises a bitstream that performs an operation when instantiated on the accelerator, and wherein the operation was identified for acceleration during compilation of source code associated with the computer application.

17. The system of claim 13, wherein hardware description language code is generated for the one or more instructions during compilation, wherein the hardware description language code for the one or more instructions connects a softcore processor executing the softcore processor object code with the logic block and is used when the one or more instructions in the softcore processor object code are executed.

18. A method, comprising:
receiving, by an accelerator operatively coupled to a host processor, softcore processor object code and a representation of hardware logic, wherein the softcore processor object code and the representation of the hardware logic are associated with respective portions of a computer application that were identified for acceleration;
instantiating a logic block in view of the representation of hardware logic;
receiving, by the accelerator, a communication to execute the softcore processor object code from the host processor;
executing the softcore processor object code, wherein the softcore processor object code includes one or more instructions to interact with the logic block to perform an operation, wherein the one or more instructions are application-specific instructions customized for one or more operations of the computer application; and
transmitting a result of the operation to the host processor.

19. The method of claim 18, wherein the representation of the hardware logic comprises a bitstream including the operation and the operation is more computationally intensive than operations included in the softcore processor object code.

20. The method of claim 18, wherein the one or more instructions were generated and added to the softcore processor object code during compilation of source code associated with the computer application.

* * * * *

UNITED STATES PATENT AND TRADEMARK OFFICE
CERTIFICATE OF CORRECTION

PATENT NO. : 10,768,916 B2
APPLICATION NO. : 16/203097
DATED : September 8, 2020
INVENTOR(S) : Drepper Page 1 of 1

It is certified that error appears in the above-identified patent and that said Letters Patent is hereby corrected as shown below:

In the Claims

In Claim 9, Column 30, Line 30, delete the second "are"

Signed and Sealed this
Sixth Day of October, 2020

Andrei Iancu
*Director of the United States Patent and Trademark Office*